(12) United States Patent
Cory

(10) Patent No.: US 10,038,450 B1
(45) Date of Patent: Jul. 31, 2018

(54) CIRCUITS FOR AND METHODS OF TRANSMITTING DATA IN AN INTEGRATED CIRCUIT

(71) Applicant: Xilinx, Inc., San Jose, CA (US)

(72) Inventor: Warren E. Cory, Redwood City, CA (US)

(73) Assignee: XILINX, INC., San Jose, CA (US)

( * ) Notice: Subject to any disclaimer, the term of this patent is extended or adjusted under 35 U.S.C. 154(b) by 250 days.

(21) Appl. No.: 14/965,752

(22) Filed: Dec. 10, 2015

(51) Int. Cl.
H03L 7/00 (2006.01)
H03M 9/00 (2006.01)

(52) U.S. Cl.
CPC .............. *H03L 7/00* (2013.01); *H03M 9/00* (2013.01)

(58) Field of Classification Search
CPC ..... G06F 1/10; G06F 1/12; G06F 1/08; G11C 7/22; H04L 25/14; H03L 7/00; H03M 9/00
See application file for complete search history.

(56) References Cited

U.S. PATENT DOCUMENTS

| | | | | |
|---|---|---|---|---|
| 5,422,918 A * | 6/1995 | Vartti | .................... | G01R 25/005 327/12 |
| 6,715,093 B1 * | 3/2004 | Farmer | ..................... | G06F 1/12 713/400 |
| 7,151,470 B1 * | 12/2006 | Xue | ......................... | H03M 7/04 341/61 |
| 7,369,069 B2 * | 5/2008 | Usugi | ....................... | G06F 1/24 341/100 |
| 7,382,823 B1 | 6/2008 | Cory | | |
| 7,594,048 B1 | 9/2009 | Edwards et al. | | |
| 7,913,104 B1 | 3/2011 | Cory et al. | | |
| 9,071,256 B1 * | 6/2015 | Reiss | ....................... | H03M 9/00 |
| 9,268,888 B1 * | 2/2016 | Leong | ..................... | G06F 13/00 |
| 2003/0161351 A1 * | 8/2003 | Beverly | .................. | H03M 9/00 370/535 |
| 2004/0223570 A1 * | 11/2004 | Adkisson | .................. | G06F 1/10 375/359 |
| 2006/0233172 A1 * | 10/2006 | Venkata | ........... | H03K 19/17744 370/391 |
| 2014/0198810 A1 * | 7/2014 | Jones | ........................ | G06F 1/10 370/507 |

* cited by examiner

*Primary Examiner* — Jaweed A Abbaszadeh
*Assistant Examiner* — Brian J Corcoran
(74) *Attorney, Agent, or Firm* — John J. King

(57) ABSTRACT

A circuit for transmitting data in an integrated circuit device is described. The circuit comprises a first data width conversion circuit configured to receive a first portion of transmit data to be transmitted in parallel; a first parallel-in, serial-out circuit configured to receive an output of the first data width conversion circuit; a first reset timer configured to provide a first reset signal to enable resetting the first data width conversion circuit; a second data width conversion circuit configured to receive a second portion of the transmit data; a second parallel-in, serial-out circuit configured to receive an output of the second data width conversion circuit; and a second reset timer configured to provide a second reset signal to enable resetting the second data width conversion circuit.

20 Claims, 15 Drawing Sheets

CIRCUITS FOR AND METHODS OF TRANSMITTING DATA IN AN INTEGRATED CIRCUIT

FIELD OF THE INVENTION

The present invention relates generally to integrated circuit devices, and in particular, to circuits for and methods of transmitting data in an integrated circuit.

BACKGROUND OF THE INVENTION

A digital system may transmit data to another location via a high-speed serial link. The data may be split across multiple serial links to increase the data capacity of the connection, where the original data is reassembled from the multiple serial links at the receiving end. For example, transmit data (TX Data) generated at 64 bits per clock cycle may be split into two 32-bit words, each transmitted through its own serial link. A serializer, such as a parallel-in, serial-out (PISO) circuit, converts each 32-bit word into a serial stream of bits. At the receiver, a deserializer, such as a serial-in, parallel-out (SIPO) circuit, regenerates the 32-bit words. Because some loss of data alignment and skew between the serial links are common, specialized alignment logic may be required to properly reassemble the original 64-bit received data (RX Data).

According to some data transmission protocols, the width of the data clocked into the transmitter (e.g. 66 bits) does not match the width of data clocked into the PISO (e.g. 64 bits). A FIFO, commonly known as a "Gearbox FIFO," is used to convert the data width from 66 bits to 64 bits. Because the system clock controlling the Gearbox FIFO and the transmitter clock controlling the PISO circuit of the transmitter may be at different frequencies, the system clock cannot be used as a reference for the phase adjustments of the transmitter clock.

Accordingly, circuits and methods that enable the transmission of data using a Gearbox FIFO and addressing transmitter inter-lane deskew are beneficial.

SUMMARY OF THE INVENTION

A circuit for transmitting data in an integrated circuit device is described. The circuit comprises a first data width conversion circuit configured to receive a first portion of transmit data to be transmitted in parallel, the first data width conversion circuit configured to receive a system clock at a first clock input to enable receiving the first portion of the transmit data; a first parallel-in, serial-out circuit configured to receive an output of the first data width conversion circuit, wherein a first transmitter clock is coupled to a second clock input of the first data width conversion circuit and to a third clock input of the first parallel-in/serial-out circuit; a first reset timer configured to provide a first reset signal to enable resetting the first data width conversion circuit; a second data width conversion circuit configured to receive a second portion of the transmit data, the second data width conversion circuit configured to receive the system clock at a fourth clock input to enable receiving the second portion of the transmit data; a second parallel-in, serial-out circuit configured to receive an output of the second data width conversion circuit, wherein a second transmitter clock is coupled to a fifth clock input of the second data width conversion circuit and to a sixth clock input of the second parallel-in, serial-out circuit; and a second reset timer configured to provide a second reset signal to enable resetting the second data width conversion circuit.

Another circuit for transmitting data in an integrated circuit device comprises a first data width conversion circuit configured to receive a first portion of transmit data to be transmitted in parallel, wherein the first data width conversion circuit is configured to receive a system clock at a first clock input to enable receiving the first portion of the transmit data; a first alignment control circuit configured to receive a first transmitter clock; a first parallel-in, serial-out circuit configured to receive an output of the first data width conversion circuit, wherein the first transmitter clock is coupled to a second clock input of the first data width conversion circuit and to a third clock input of the first parallel-in, serial-out circuit; a second data width conversion circuit configured to receive a second portion of the transmit data, wherein the second data width conversion circuit is configured to receive the system clock at a fourth clock input to enable receiving the second portion of the transmit data; a second alignment control circuit configured to receive a second transmitter clock; and a second parallel-in, serial-out circuit configured to receive an output of the second data width conversion circuit, wherein the second transmitter clock is coupled to a fifth clock input of the second data width conversion circuit and a sixth clock input of the second parallel-in, serial-out circuit.

A method of transmitting data in an integrated circuit device is also described. The method comprises configuring a first data width conversion circuit to receive a first portion of transmit data to be transmitted in parallel and to receive a system clock at a first clock input to enable receiving the first portion of the transmit data; configuring a first parallel-in, serial-out circuit to receive an output of the first data width conversion circuit, wherein a first transmitter clock is coupled to a second clock input of the first data width conversion circuit and to a third clock input of the first parallel-in/serial-out circuit; configuring a first reset timer to provide a first reset signal to enable resetting the first data width conversion circuit; configuring a second data width conversion circuit to receive a second portion of the transmit data to receive the system clock at a fourth clock input to enable receiving the second portion of the transmit data; configuring a second parallel-in, serial-out circuit to receive an output of the second data width conversion circuit, wherein a second transmitter clock is coupled to a fifth clock input of the second data width conversion circuit and to a sixth clock input of the second parallel-in, serial-out circuit; and configuring a second reset timer to provide a second reset signal to enable resetting the second data width conversion circuit.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The circuits and methods enable aligning serial data from data width conversion circuits across multiple serial transceivers. A circuit for transmitting data in an integrated circuit device may be implemented having multiple data transmitters using a data width conversion circuit operating as a Gearbox FIFO, where each of the data transmitters has a separate reset timer configured to provide a reset signal to enable resetting the data width conversion circuits. Other circuits for transmitting data in an integrated circuit device having multiple data transmitters using a data width conversion circuit implement alignment control circuits associated with transmitter. The alignment control circuits can be controlled by a common reset signal for each of the transmitters, or by using latency measurements generated by the data width conversion circuits. While specific references may be made to a reset, it should be understood that a release of a reset on a transmitter circuit (i.e. a transmitter or a portion of a transmitter) would be considered to include the transmitter circuit coming out of an "off," "idle," or "wait" state during a startup of the transmitter circuit. It also would be considered to include the transmitter circuit initiating or continuing an internal startup procedure that results in the transmitter circuit entering its normal mode of operation. While specific reference is made to the releasing of a reset applied to a transmitter circuit, it is contemplated that an initial startup of a transmitter circuit is considered to be a releasing of a reset of a transmitter circuit. As will be described in more detail below, applying a control signal to start up a transmitter circuit from an idle state during an initial startup would be considered to be a releasing of a reset signal.

Figure 1:
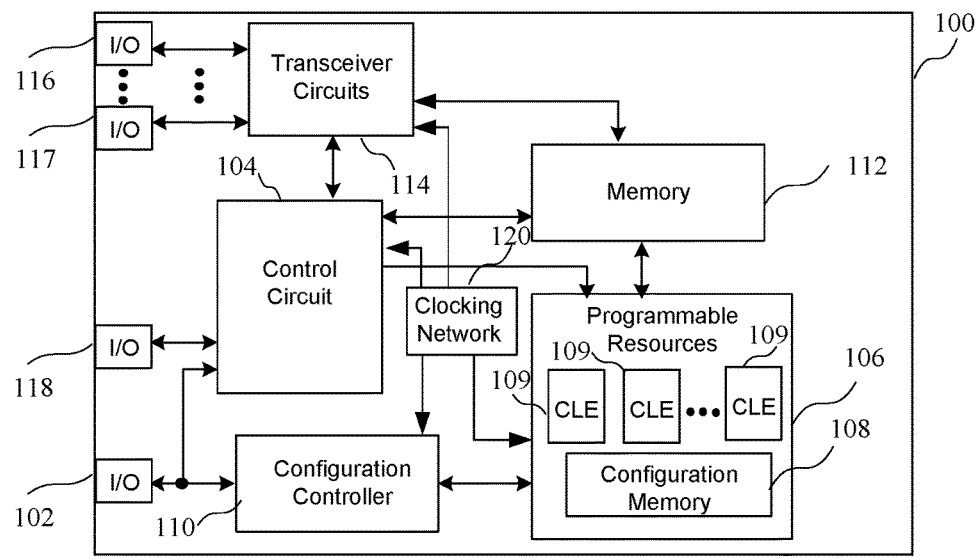
FIG. 1 is a block diagram of an integrated circuit comprising a transceiver circuit having a plurality of transmitter circuits.

Turning first to FIG. 1, a block diagram of an integrated circuit 100 comprising a transceiver circuit having a plurality of transmitter circuits is described. In particular, an input/output port 102 is coupled to a control circuit 104 that controls programmable resources 106 having configuration memory 108. Configuration data may be provided to the configuration memory 108 by a configuration controller 110. The configuration data enables the operation of configurable logic elements 109. A memory 112 may be coupled to the control circuit 104 and the programmable resources 106. Transceiver circuits 114 may be coupled to the control circuit 104, programmable resources 106 and the memory 112, and may transmit signals from and receive signals at the integrated circuit device by way of I/O ports 116 and 117. Other I/O ports may be coupled to circuits of the integrated circuit device, such as I/O port 118 that is coupled to the control circuit 104 as shown. A clocking network 120 is coupled to various elements of the circuit of FIG. 1. The circuits and methods of transmitting data described in more detail below may be implemented by various elements of the circuit of FIG. 1, and particularly transmitters of the transceiver circuits 114 for transmitting data in parallel.

Figure 2:
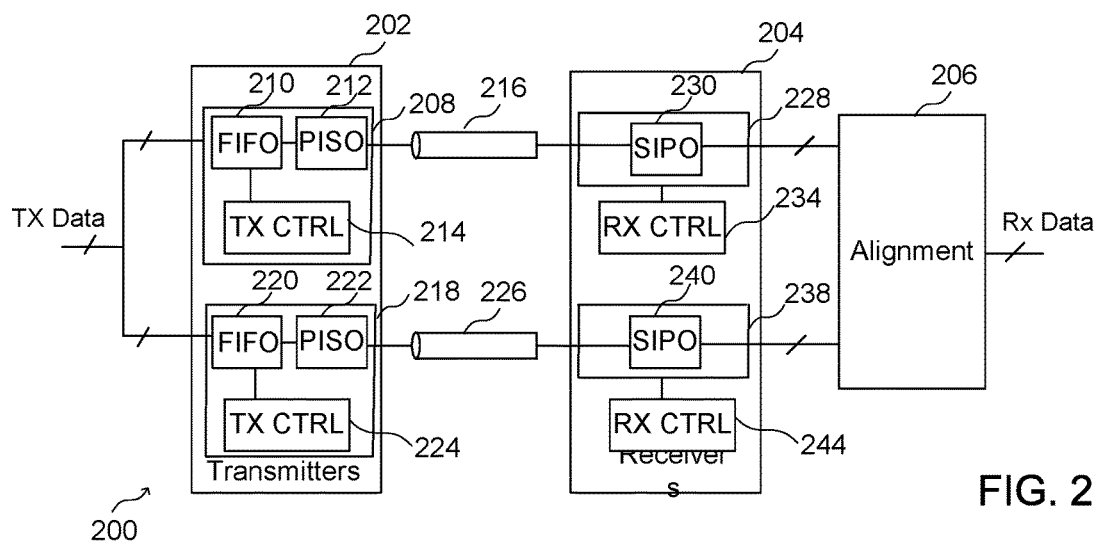
FIG. 2 is a block diagram of a communication network showing a plurality of transmitters coupled to a corresponding plurality of receivers.

Turning now to FIG. 2, a block diagram of a communication network 200 having a plurality of transmitters coupled to a corresponding plurality of receivers is shown. In particular, a transmitter device 202 having a plurality of transmitters is coupled to a receiver device 204 having a plurality of corresponding receivers. An alignment circuit 206 is coupled to the receiver device 204, and is configured to generate the received data (RX Data) based upon the transmit data (TX Data). The transmitter device 202 comprises a first transmitter 208 having a first-in, first-out (FIFO) circuit 210 and a parallel-in, serial-out (PISO) circuit 212. A transmitter control circuit 214 controls the transmission of data from the first transmitter to a corresponding receiver in the receiver device 204 by way of a transmission line 216. The transmitter device 202 also comprises a second transmitter 218 having a FIFO circuit 220 and a PISO circuit 222. A transmitter control circuit 224 controls the transmission of data from the second transmitter to a corresponding receiver in the receiver device 204 by way of a transmission line 226.

The receiver device 204 comprises a first receiver 228 having serial-in, parallel-out (SIPO) circuit 230 coupled to receive the serial data from the transmission line 216, and generate parallel output data coupled to the alignment circuit 206. A receiver control circuit 234 controls the operation of the receiver 228 to generate the parallel output data of the receiver 228. A second receiver 238 having a SIPO 240 is coupled to receive the serial data from the transmission line 226, and generate parallel output data coupled to the alignment circuit 206. The alignment circuit 206 enables reconstructing the transmit data from the two transmitters to generate the parallel received data (RX Data) based upon the data of the two serial streams received at SIPO 230 and SIPO 240. A receiver control circuit 244 controls the operation of the receiver 238 to generate the parallel output of the receiver 238. While two serial streams are generated by two transmitters, it should be understood that a greater number of data streams can be generated by additional transmitters, and that two transmitters are shown by way of example. Transmitters that can be implemented as transmitters 208 and 218 will be described in more detail below in reference to FIGS. 4-21.

Figure 3:
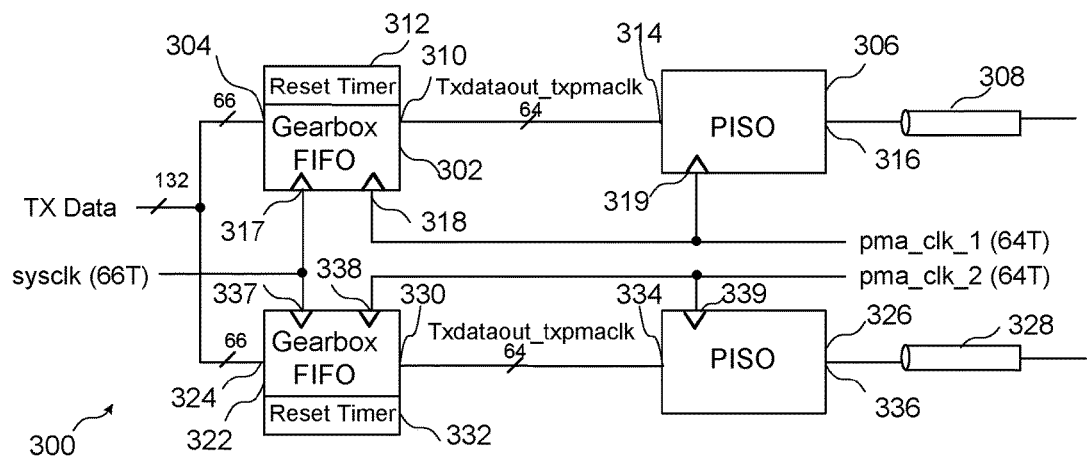
FIG. 3 is a block diagram of a circuit having a plurality of transmitters for transmitting data from a single data stream in parallel.

Turning now to FIG. 3, a block diagram of a circuit 300 having a plurality of transmitters for transmitting data in parallel is shown. The circuit 300 comprises a data width conversion circuit 302, also known as a Gearbox FIFO, for converting an input data signal having a first width, such as a 66-bit parallel input signal, received at a first input 304 to a data signal having a second width, such as a 64-bit parallel signal, generated at an output 310 under control of a reset timer 312. While the various implementations could be used with data width conversion circuits converting data between any number of data widths, it should be noted that the invention is particularly beneficial when the two widths are nearly the same, such as 64B66B data transmission described in various implementations. A circuit for implementing the reset timer 312 will be described in more detail in reference to FIG. 4. The output 310 of the data width conversion circuit 302 is coupled to the PISO 306 at an input 314. A serial output data stream based upon the parallel input data provided to the input 314 is generated at an output 316 and coupled to the transmission line 308. The PISO is the transmitter portion of the physical media attachment (PMA), and is responsible for receiving parallel digital data and transmitting it over the serial lines one bit at a time. The highest-speed PISO clock may be taken from a high-speed PLL output, and may be a clock is divided down into lower-speed clocks used within the PISO, culminating with a pma clock appropriate for clocking the original parallel data into PISO.

Clock signals are also routed to the data width conversion circuit 302 and the PISO circuit 306 to enable the generation of the serial output data based upon the input data. A system clock (sysclk), which may also be commonly referred to as a fabric clock, is coupled to a first clock input 317 of the data width conversion circuit. A first transmitter clock signal, shown here as pma_clk_1 enabling the transmission of data by the PISO 306, is coupled to a second clock input 318 of the data width conversion circuit 302 and a clock input 319 of the PISO 306. The system clock is a lower speed clock for receiving the 66 parallel input bits, while the transmitter clock is a higher speed clock for generating the 64 bit data at the output 310. By way of example, the system clock could be approximately 156.25 MHz, while the transmitter clock could be approximately 161.13 MHz. Therefore, data is written into and read from the data width conversion circuit at the same rate: 156.25×66=161.13×64=10.3125 Gbps.

The circuit 300 also comprises a data width conversion circuit 322 for converting another input data signal also having the first width received at an input 324 to a data signal having the second width, generated at an output 330 under control of a reset timer 332. The two 66-bit input signals coupled to the inputs 304 and 324 of the first and second data width conversion circuits are portions of 132 bit transmit data. The output 330 of the data width conversion circuit 322 is coupled to the PISO 326 at an input 334. A second serial output data stream based upon the parallel input data provided to the input 334 is generated at an output 336 and coupled to the transmission line 328. The system clock is also coupled to a first clock input 337 of the data width conversion circuit 322. A second transmitter clock signal, shown here as pma_clk_2 associated with the second transmitter enabling the transmission of data by the PISO 326, is coupled to a second clock input 338 of the data width conversion circuit 322 and a clock input 339 of the PISO 326.

The system clock generates the 132-bit TX Data and clocks the data into the data width conversion circuits 302 and 322. The transmitter clocks (i.e. pma_clk_1 and pma_clk_2) clock 64-bit data into the PISOs 306 and 326, respectively. Each transmitter clock has timing requirements with higher-speed clocks used within the PISO, so the clock is preferably generated locally within the physical media attachment (PMA) layer, where the transmitter clocks may not be aligned either with each other or with the system clock. The unknown phase relationship between transmitter clocks, and the corresponding difference of data latency through the FIFOs, may lead to considerable skew (i.e. a difference between the time of appearance of corresponding data) between the serial links.

Assuming that data written into the data width conversion circuits is properly aligned, the only requirement to assure good alignment at the serial outputs is that the total transmitter data latency, end to end, is the same over all the transmitters. Although the clock phase relationships between the transmitter clocks contribute to the calculation of latency, the internal clock phases used within the transmitters is not important in the implementation of FIG. 3. Therefore, there is no requirement to align the transmitter clocks between the several transmitters, as will be described in more detail below. Data is continuously written into and read from the data width conversion circuit at the same rate. Therefore, its data latency effectively does not vary, in spite of varying input and output clock phases. The data width conversion circuit latency established at reset/startup time remains invariant thereafter. Therefore, if the data width conversion circuit can be started up out of reset with a particular latency established, and this same latency is established for each transmitter, then all transmitters will have matching data latencies, with minimal resulting skew.

Figure 4:
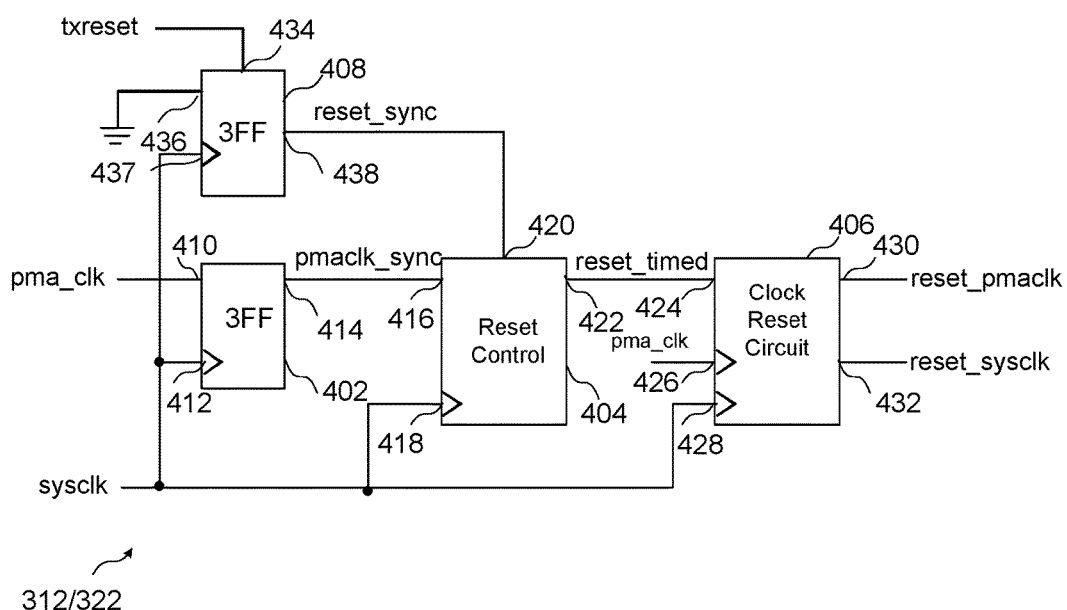
FIG. 4 is a block diagram of a reset timer circuit implemented in the circuit of FIG. 3.

Turning now to FIG. 4, a block diagram of reset timers 312 and 332 implemented in the circuit of FIG. 3 is shown. The reset timer comprises a plurality of flip-flops 402, shown here as 3 flip-flops for generating a stable pma-clk_sync output in the transmitter clock domain. A reset control circuit 404 is coupled to the synchronized pma-clk_sync signal from the plurality of flip-flops 402 and generates a timed reset (reset_timed) signal that is coupled to a clock reset circuit 406. A reset signal (reset_sync) is also generated by a second plurality of flip-flops 408.

More particularly, the pma_clk is coupled to an input 410 of the plurality of flip-flops 402, which also receives the system clock (sysclk) at a clock input 412. Synchronized transmitter clock (pmaclk_sync) signal is generated at an output 414 and coupled to an input 416 of the reset control circuit 404, which also received the sysclk at a clock input 418. The reset control circuit receives the synchronized reset (reset_sync) signal at an input 420 and generates the timed reset (reset_timed) signal at an output 422 and coupled to an input 424. The clock reset circuit 406 also receive the transmitter clock (pma_clk) at a clock input 426 and the system clock at a clock input 428. A transmitter reset signal (reset_pmaclk) is generated at an output 430 and a system reset signal (reset_sysclk) is generated at an output 432. The plurality of flip-flops 408 is configured to generate the synchronized reset signal in response to a transmitter reset (txreset) signal coupled to an input 434, a ground signal coupled to the input 436, and the system clock coupled to a clock input 437. The txreset signal is an external reset signal separately applied to each of the transmitters. It is not required that the timing of txreset signal be identical across all the transmitters. The transmitter reset signal and the system reset signal resets the logic in their respective clock domains. The output reset_sysclk resets all logic of the data width conversion circuit (including addressing logic) that is clocked by system clock. Similarly, the transmitter reset (reset_pmaclk) is used to reset the logic clocked by transmitter clock. For example, the write address (in the system clock domain) is set to its initial value in response to the system reset signal, and the read address (in the transmitter clock domain) is set to its initial value in response to the transmitter reset signal.

In this architecture, the reset timer circuits are clocked by system clock. Both the transmitter clock (pma_clk) and the transmit reset signal (txreset) are synchronized into the system clock domain via three-flip-flop synchronizers of the plurality of synchronizers 402 and 408 (to protect against metastability). The synchronized signals are reset_sync and pmaclk_sync. When txreset is high, reset_sync, reset_timed, reset_pmaclk, and reset_sysclk all go high asynchronously, resetting the logic of the reset control circuit 404, which comprises a Finite State Machine (FSM) as will be described in FIGS. 10-13 below, and all data width conversion circuit addressing logic. When txreset, and subsequently reset_sync, go low, reset_timed, reset_sysclk, and reset_pmaclk do not immediately follow suit. Instead, the FSM will determine when reset_timed, and subsequently reset_sysclk and reset_pmaclk, are deasserted, waiting until sysclk and pma_clk have a particular phase relationship.

The clock reset circuit 406 enables a reset signal (reset_timed) synchronized by a rising sysclk to be copied to the pma_clk domain on falling pma_clk. To assure predictable timing in the operation of the clock reset circuit 406, it is required that the phase between sysclk and pma_clk be arranged such that when the deasserted reset is copied to the pma_clk domain, there is good setup/hold margin from the rising sysclk to the falling pma_clk.

An example of the operation of the FSM of the reset control circuit 404 of FIG. 4 will now be described. When the FSM comes out of reset, it waits for a low value of pmaclk_sync, followed by high pmaclk_sync. This indicates a rising edge on pma_clk, and therefore closely aligned rising edges of sysclk and pma_clk. It should be noted that this alignment occurs several cycles previously at the input to the three-flip-flop synchronizer for pma_clk. Meanwhile, the FSM continues holding reset_timed high. After the rising edge of pma_clk is detected, the FSM waits a fixed number of clock cycles and then clears reset_timed. The number of clock cycles to wait is set such that when the deasserted reset is copied from the sysclk domain to the pma_clk domain, rising sysclk and rising pma_clk are again closely aligned, resulting in nominally ½ cycle of setup margin and ½ cycle of hold margin from a rising sysclk to a falling pma_clk. This operation results in the same data latency through all data width conversion circuits, which results in minimal skew on the transmitter serial link between transmitters. As will be described in more detail below, it may be beneficial to monitor for multiple rising edges of pma_clk to limit the susceptibility of this operation to clock jitter.

It should be noted that the FSM does not have infinite control over the sysclk and pma_clk phase relationship. There may be 32 available phases between sysclk and pma_clk, for example, where one will be selected. Hence, the precision of the resulting alignment between transmitters is limited.

Figure 5:
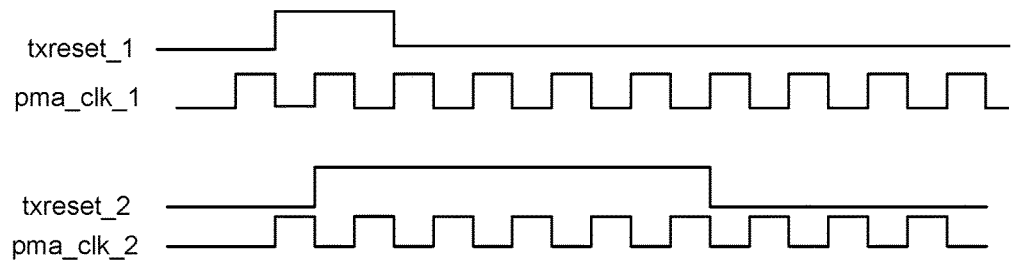
FIG. 5 is a timing diagram showing two transmitter clocks, associated with two transmitters transmitting data in parallel, which are not aligned.

As shown in the timing diagram of FIG. 5, the pma_clk signals for two transmitter PMAs are not aligned. It also shows the externally applied reset signal for the two transmitter data width conversion circuits, where the external reset timing does not match between the two transmitters.

Figure 6:
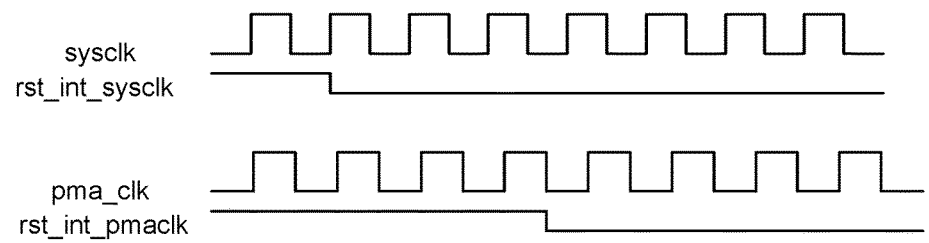
FIG. 6 is a timing diagram showing the transfer of deasserted reset signals from a system clock domain to a transmitter clock domain.

As shown in FIG. 6, the transfer of the deasserted reset signal from the sysclk domain to the pma_clk domain upon falling pma_clk is shown. The resets here are active-high, so that the falling transitions correspond to the end of the reset condition. Signals rst_int_sysclk and rst_int_pmaclk are internal reset signals generated in the clock reset circuit 406. Signal rst_int_sysclk is a synchronized copy of reset_timed in the sysclk domain, and rst_int_pma_clk is a synchronized copy of rst_int_sysclk in the pma_clk domain, copied upon the falling pma_clk. The delay of multiple cycles from rst_int_sysclk to rst_int_pmaclk is due to the use of a three-flip-flop synchronizer for this transfer. It should be noted that the reset control circuit 404 has timed this transition to occur with ample setup and hold margin, since the transition on rst_int_sysclk occurs very near rising pma_clk.

Figure 7:
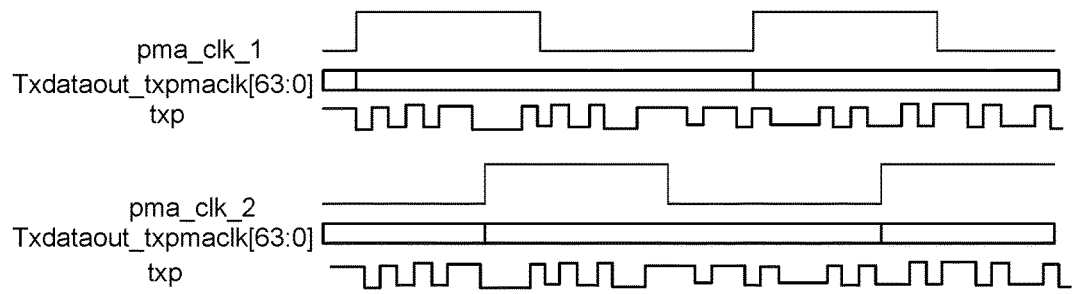
FIG. 7 is a timing diagram showing a transmitter clock and serial transmit data for each transmitter.

Examples of serial outputs txp from the two transmitters is shown in FIG. 7, where each transmitter has the same data stream. FIG. 7 also shows the pma_clk and the parallel data going into the PISO for each transmitter. Parallel data has different timing into the PISO in the two transmitters, and the parallel data also has different alignment between the two transmitters. These two differences compensate for each other, resulting in good alignment between the serial data, as a result of the use of the reset circuit of FIG. 3. As shown in FIG. 7, the output data is aligned.

Figure 8:
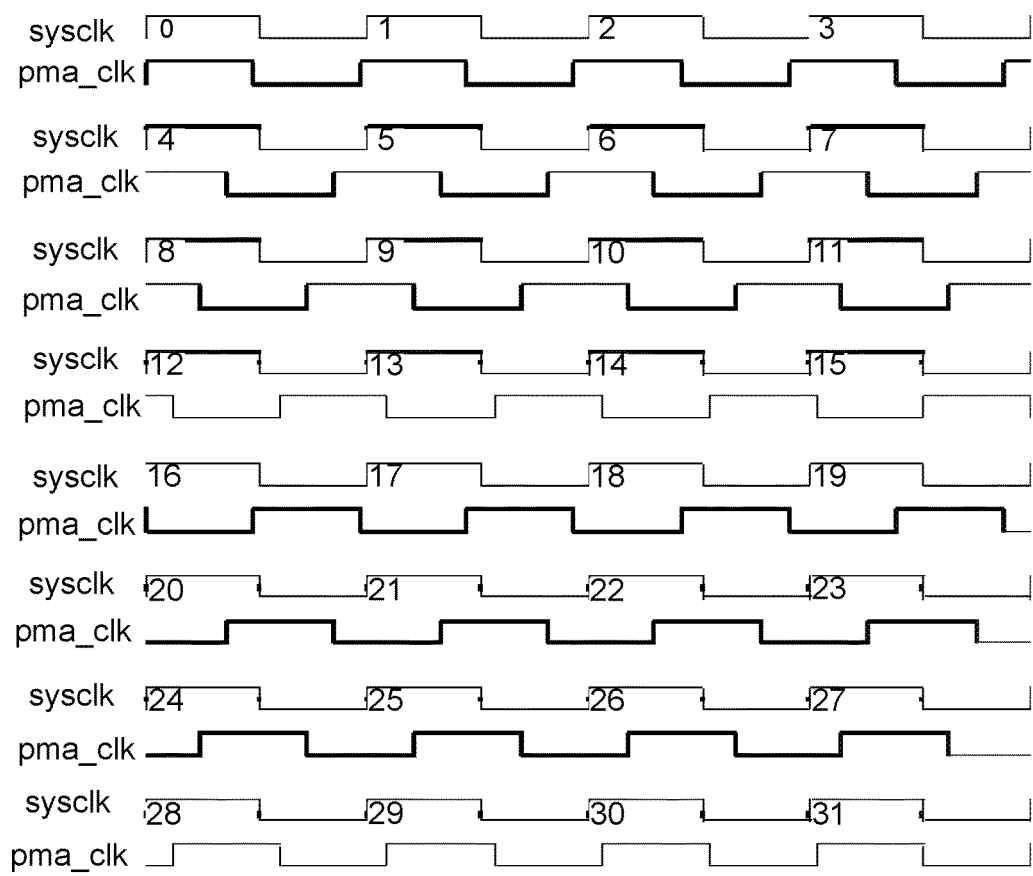
FIG. 8 is a timing diagram showing an enumeration of a phase variation for a 64B66B data transmission.

FIG. 8 shows an enumeration of phase variation for a 64B66B data transmission. The sysclk period is 66T, and the pma_clk period is 64T. The phase of sysclk relative to pma_clk sweeps smoothly through a full cycle over 32 sysclk cycles, then returning to the original alignment. A modulo 32 phase counter, incremented by 1 at each cycle, can represent each sysclk phase as shown in FIG. 8. When an edge is detected, the current phase counter value is recorded. Because there is no assurance that the counter values will correspond to specific phases exactly as shown in FIG. 8, the reset control circuit 404 determines an average phase counter value that most closely matches the pma_clk rising edge time, as will be described in more detail below in reference to FIGS. 12 and 13.

Figure 9:
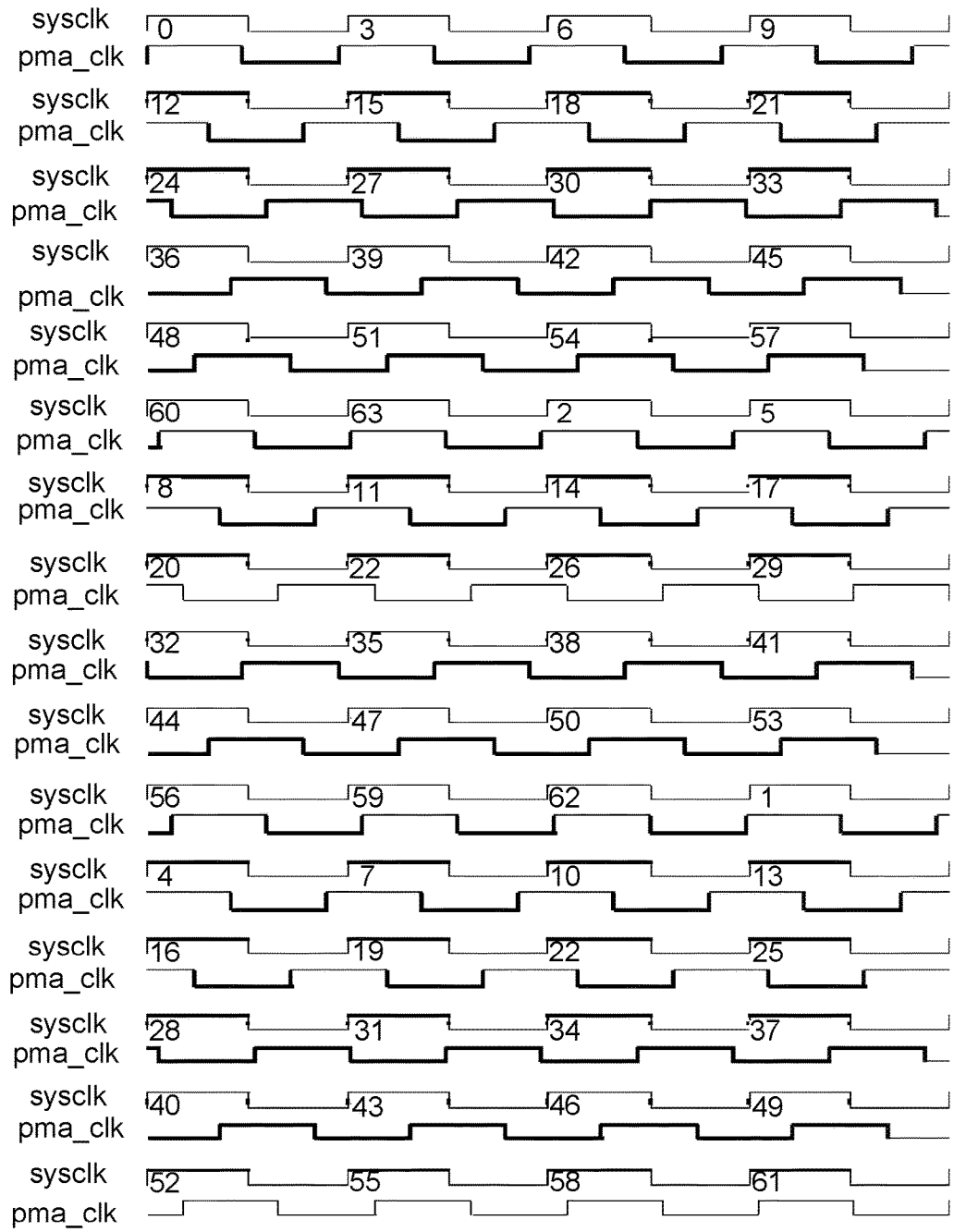
FIG. 9 is a timing diagram showing an enumeration of a phase variation for a 64B67B data transmission.

FIG. 9 shows an enumeration of phase variation for a 64B67B data transmission. In FIG. 9, clocks sysclk and pma_clk start with aligned rising edges at phase counter value 0. Subsequently, the phase of rising sysclk sweeps smoothly with respect to pma_clk until the edges are nearly aligned at counter value 63. However, this alignment may not exactly match the initial alignment. The phase of rising sysclk sweeps through another pma_clk cycle until counter value 1, when the rising edges are again nearly aligned, but matching neither of the previous two alignments. Sysclk must sweep through a third cycle before returning to the original alignment. The appropriate phase counter for this case is a modulo 64 counter incremented by 3 at each cycle, as shown in FIG. 9, since 64 and 67 differ by 3 and are mutually prime.

Figure 10:
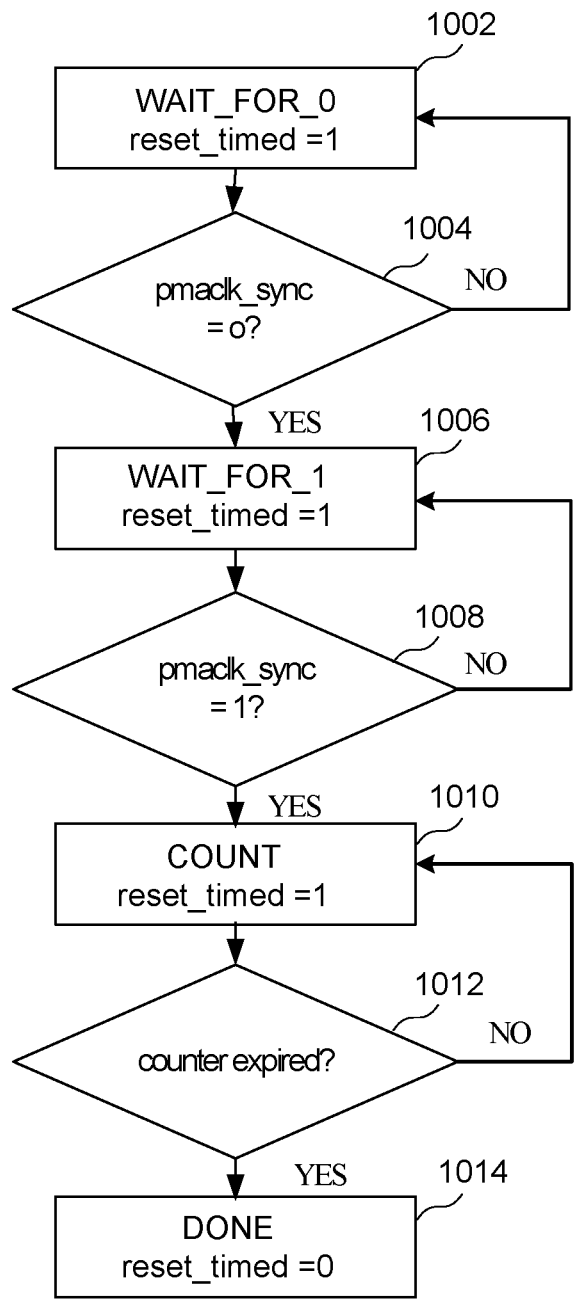
FIG. 10 is a flow chart showing a method for controlling reset timing in a data width conversion circuit.

Turning now to FIG. 10, a method for controlling reset timing in a data width conversion circuit is shown. The method of FIG. 10 can be performed for example in the reset timers 312 and 332, and more particularly as an FSM of the reset control circuit 404. The method of FIG. 10 generally looks for low value of pmaclk_sync, followed by a high value of pmaclk_sync. This transition indicates the presence of a rising edge on pma_clk in the vicinity of the sampling edges of sysclk, and therefore synchronization of the system clock and the transmitter clock. The pmaclk_sync is a synchronization value of the pma_clk, and the sampled low value is followed by a sampled high value indicates the presence of a rising edge on the pma_clk in the vicinity of the sampling edges of the system clock. With the reset_sync=1, a reset synchronization is to be performed and enters a WAIT_FOR_0 state at block 1002. During the block 1002 while waiting for the pmaclk_sync value to be equal to 0, the reset_timed signal remains asserted by maintaining a value of 1. After the pmaclk_sync is determined to be equal to 0 at the block 1004, the finite state machine waits for the pmaclk_sync signal to be equal to 1, and maintains the reset_timed value at 1 holding the system in reset at a block 1006. After the pmack_sync signal is determined to be equal to 1 at a block 1008, a counter is started at the block 1012, during which the reset_timed value is maintained at 1. After the counter expires at a block 1012, the reset signal is released by setting the reset_timed value to 0 at a block 1016. It should be noted that there is no processing in the WAIT_FOR_0 state 1002, the WAIT_FOR_1 state 1006 and COUNT state 1010 other then the setting of reset_timed=1, but that the FSM waits for the next clock edge before proceeding.

It is beneficial to provide a delay before releasing the reset signal to provide predictable, reliable timing. That is, the particular delay may be selected such that any clock domain crossing that occurs in the data width conversion circuit has predictable, reliable timing and satisfies setup/hold requirements in the destination clock domain. The fixed period established by the counter is selected to prevent metastable conditions in the data width conversion circuit startup, and therefore establishing favorable timing of reset deassertion for the transfer of the reset signals reset_pmaclk and reset_sysclk from the system clock domain to the transmitter clock domain.

It should be noted that a sampled 0 followed by a sampled 1 of the pma_clk could indicate either a rising edge or a falling edge on pma_clk, depending on the relative frequencies of sysclk and pma_clk. If sysclk is slower than pma_clk, the rising edges of sysclk that sample pma_clk move to the right with respect to the pma_clk phase as time progresses. Clock sysclk will sample pma_clk first before a rising edge, then following a rising edge. A 0-to-1 transition therefore indicates the presence of rising pma_clk near rising sysclk. If sysclk is faster than pma_clk, the rising edges of sysclk move to the left with respect to the pma_clk phase as time progresses. Sysclk will sample pma_clk first after a rising edge, then before a rising edge. A 1-to-0 transition therefore indicates the presence of a rising pma_clk near a rising sysclk in this case. A 0-to-1 transition indicates a falling pma_clk near a rising sysclk.

Figure 11:
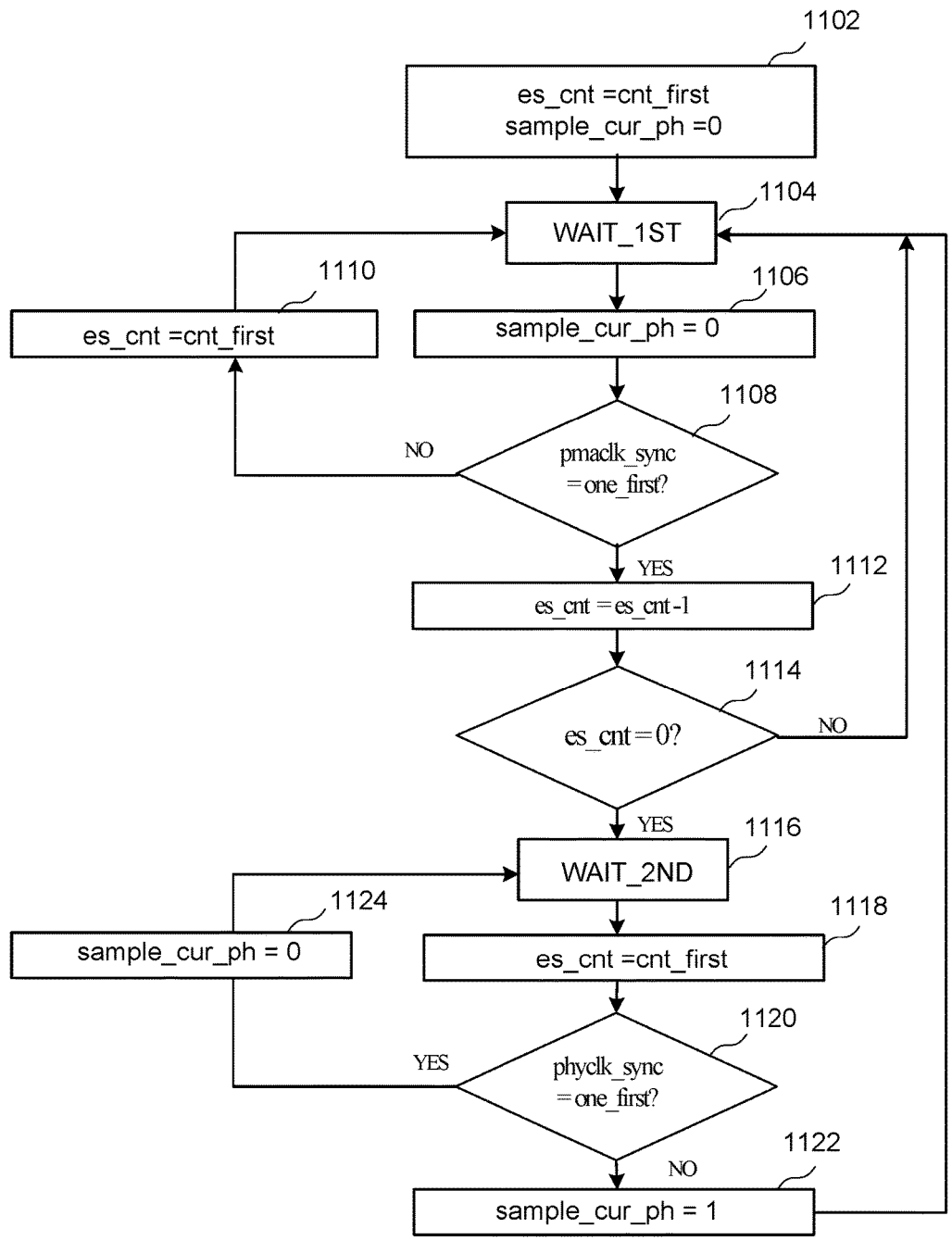
FIG. 11 is a flow chart showing the operation of a first FSM of a reset control circuit of a reset timer of a transmitter.
Figure 12:
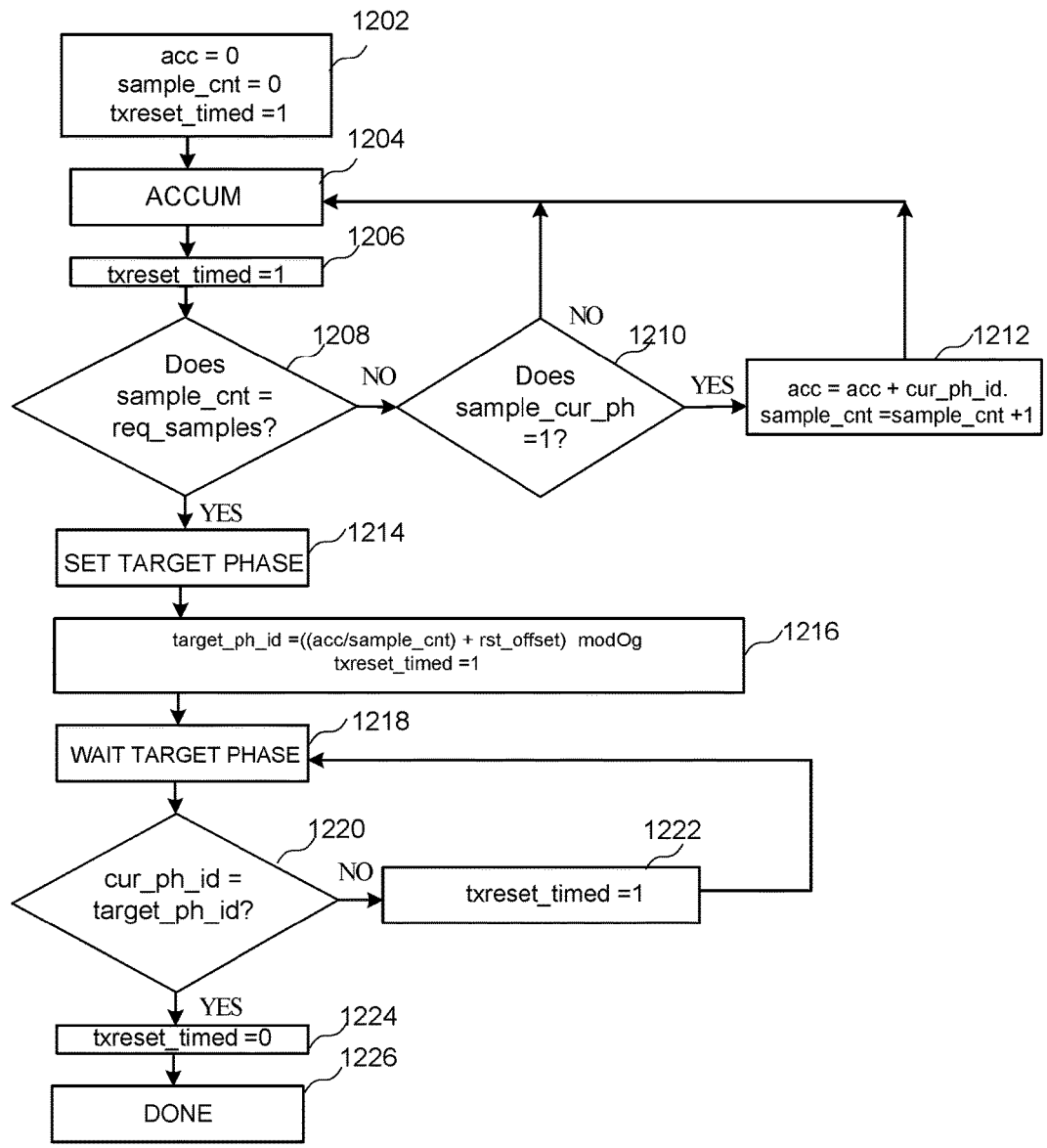
FIG. 12 is a flow chart showing the operation of a second FSM of a reset control circuit of a reset timer of a transmitter.

Turning now to FIGS. 11 and 12, detailed methods of generating release signals are shown. The process of FIG. 10 may be enhanced to mitigate the effects of jitter and metastability. One improvement is to require some number of consecutive sampled values of pma_clk to match the desired first value (i.e. 0 in FIG. 10) before looking for the opposite value. This improvement, as described in FIG. 11, assures that the detected first value is a stable, not metastable, value for at least one of the samples, so that the desired edge is in fact being detected. The second improvement is to record the position of multiple rising edges of pma_clk then to use the average edge alignment to determine the reset timing, as described in FIG. 12. The use of the average edge alignment tends to average out the effects of jitter. The calculation of an average alignment requires identifying the phase at which a rising edge is detected, and requires an understanding of the phase variation that occurs over time.

The more detailed method uses two FSMs in the reset control circuit 404 of the reset timer to control the reset timing. The first FSM, the Edge Detector FSM of FIG. 11, is responsible for detecting the desired edge of pma_clk. Its output is a control signal sample_cur_ph. In a first phase of the FSM of FIG. 11, the FSM determines whether a predetermined number of consecutive matching values are detected. In a second phase of the FSM of FIG. 11, the FSM will look for the opposite value. A one_first value indicates whether the FSM will look for 1 first, followed by 0; or consecutive 0's first, followed by 1. This affects whether the FSM will detect a rising or falling edge on pma_clk. A cnt_first value indicates how many consecutive samples must match the desired first value before proceeding to watch for the second value, assuring that a stable value is being sampled.

A high pulse on FSM input signal reset_sync initiates operation of the FSM at a block 1102, where a count value es_cnt is set equal to cnt_first and sample_cur_ph is set equal to zero, indicating that an edge has not been found. Upon the next clock edge, the FSM proceeds from the WAIT_1ST state at a block 1104, maintaining the sample_cur_ph value of 0 at a block 1106. At a block 1108, it is determined whether the pmaclk_sync value is equal to one_first. If not, the es_cnt value is set equal to cnt_first at a block 1110, and the FSM returns to wait for the next clock edge at the block 1104. If the pmaclk_sync value is equal to one_first (i.e. if the one_first value is set to indicate that the FSM will look for a one first, followed by a 0, and the pmaclk_sync value indicates that a 1 has been found, or conversely, if the one_first value is set to indicate that the FSM will look for a zero first, followed by a 1, and the pmaclk_sync value indicates that a 0 has been found) at the block 1108, the es_cnt value is decremented by 1 at a block 1112. It is then determined whether the es_cnt value is equal to 0 at a block 1114. If not, the FSM returns to wait for the next clock edge at the block 1104. It should be noted that any occurrence of a pmaclk_sync value not matching one_first causes es_cnt to revert to the cnt_first value at the block 1110. Therefore, the YES condition from the block 1114 is satisfied only if the pmaclk_sync value is equal to one_first for the consecutive number of clock edges indicated by cnt_first. The requirement to match this consecutive number of pmaclk_sync values ensures that the FSM is reading a stable value of pma_clk (as indicated by pmaclk_sync). It should be further noted that there is no processing in the WAIT_1ST state 1104 and the WAIT_2ND state 1116, but that the FSM waits for the next clock edge before proceeding.

After the required consecutive number of pmaclk_sync values matching one_first are observed, the FSM follows the YES branch from the block 1114 to a block 1116, where it waits for the opposite value of pmaclk_sync to be detected. After the next clock edge, at a block 1118, es_cnt is set equal to cnt_first in preparation for the FSM's eventual return to the WAIT_1ST state at the block 1104, and it is determined whether the pmaclk_sync value is still equal to one_first at a block 1120. If so, the desired clock edge (a number of consecutive 1's followed by a 0, or a number of consecutive 0's followed by a 1) has not been detected, and sample_cur_ph is maintained at 0 at the block 1126. If it is determined that the pmaclk_sync value is not equal to one_first at the block 1120, then sample_cur_ph is set equal to 1, indicating that the edge has been detected. The FSM then returns to the block 1104 to watch for the next occurrence of the desired edge. Once the FSM has returned to the block 1104, after the next clock edge, sample_cur_ph will be set to 0 at the block 1106. Therefore, the signal sample_cur_ph is high for one clock cycle in response to the detection of the desired edge in pmaclk_sync. This signal sample_cur_ph serves as a control input for a second FSM in FIG. 12.

Referring to FIG. 12, a flow chart shows a second FSM that is responsible for determining the time at which the reset (treset_timed) of the data width conversion circuit should be deasserted. When sample_cur_ph goes high, the desired edge of pma_clk has been detected, and the second FSM of FIG. 12 may record the phase counter value cur_ph_id. With reset_sync signal set at 1, an accumulate (acc) value is set equal to 0, the sample_cnt is set equal to 0 (where sample_cnt is the number of edges that are detected), and the reset time is maintained at 1 at a block 1202. After an accumulation state (ACCUM) at a block 1204, the timed_reset is maintained at a value of 1 at block 1206. It is then determined whether a sample_cnt is equal to a req_samples value (which is the desired number of edges that need to be detected) at a block 1208. If not, it is determined whether the sample_cur_ph is equal to 1 at a block 1210, indicating that another edge is detected. If so, accumulate value is incremented by the cur_ph_id and the sample_cnt is incremented at a block 1212. If the sample_cnt is determined to be equal to the req_samples value at block 1210, the FSM enters a set TARGET PHASE state 1214, and then a target_ph_id is set equal to (acc/sample_cnt+rst_offset) mod Og at a block 1216. The FSM than enters a waiting for TARGET PHASE state at a block 1218, and determines whether the cur_ph_id is equal to the calculated target_ph_id at a block 1220.

The FSM calculates target_ph_id as a fixed offset (rst_offset) from the average phase at which edges were detected at the block 1216. RST_OFFSET is a constant that is set such that all clock domain crossings in the data width conversion circuit will occur with predictable timing during startup, without metastability. RST_OFFSET defines the offset of the target phase id (when txreset_timed will be cleared going into state DONE), relative to the average phase that was identified by the edge detection operation in state ACCUM. When it is determined that the cur_ph_id is equal to the target_ph_id at block 1220, reset_timed is deasserted by setting the reset_timed equal to 0 at a block 1224, and the FSM is finished at a block 1226. It should be noted that there is no processing in the ACCUM state 1204, the SET TARGET PHASE state 1214, and the WAIT TARGET PHASE state 1218, but that the FSM waits for the next clock edge before proceeding.

It is important to note that the calculation of an "average" phase has an important benefit beyond mitigating the effects of jitter. For 64B67B, when an edge is detected (i.e. at phase id 3, 2, or 1 in FIG. 9), the exact timing between the rising edges is unknown, and the FSM cannot distinguish whether the phase relationship most closely matches 3, 2, or 1 in FIG. 9. However, by taking an average over multiple detected edges, all of the alignments 3, 2, and 1 will be seen. The use of an average phase then achieves tighter control over the phase alignment than does alignment based on a single edge detection only.

One consideration in determining an average phase is that in general, the appropriate "average phase" might not be the arithmetic average of the several phase values. For example, suppose there are 32 phase values ranging from 0 to 31. Four sampled values may be 0, 31, 30, 31. It is clear that the appropriate average phase is 31. However, the arithmetic average of the four phases is 92/4=23, a thoroughly inappropriate value.

To avoid this problem, coming out of reset, the cur_ph_id logic freezes the value of cur_ph_id at the midpoint of possible phase values until the first phase value is accumulated into acc in the Reset Timer process. Assuming that the total spread of sampled phase values will be less than 180 degrees, this guarantees that the sampled values will not cross the N−1:0 wraparound point. Therefore, a simple arithmetic average will accurately indicate the appropriate average phase. The FSM of FIG. 12 calculates this arithmetic average, accumulating the sampled cur_ph_id values as the sum acc at a block 1212, and calculating the average phase as a simple division at a block 1216. Therefore, the complexities of an average phase involving the N−1:0 wraparound point have been eliminated, assuming that the total sample variation is less than 180 degrees.

For example, assuming there are 32 phase values, cur_ph_id will be frozen at 16 (32/2) until a phase value—that is, 16—is stored into acc as the first phase sample value. If the total spread of sampled phase values is less than 180 degrees (less than 32/2=16), then no sample can be separated from the first sample, 16, by more than 16−1, or 15. If the first value 16 happens to be the lowest sample, then no sample can be higher than 16+15=31; that is, no high sample will wrap around the 31:0 boundary to a low value. If 16 happens to be the highest sample, then no sample can be lower than 16−15=1.

Hence, the wraparound boundary 31:0 is never wholly included in the range of phase variation, so there is no need to compensate for the wraparound nature of phase numbers in calculating the average phase.

Figure 13:
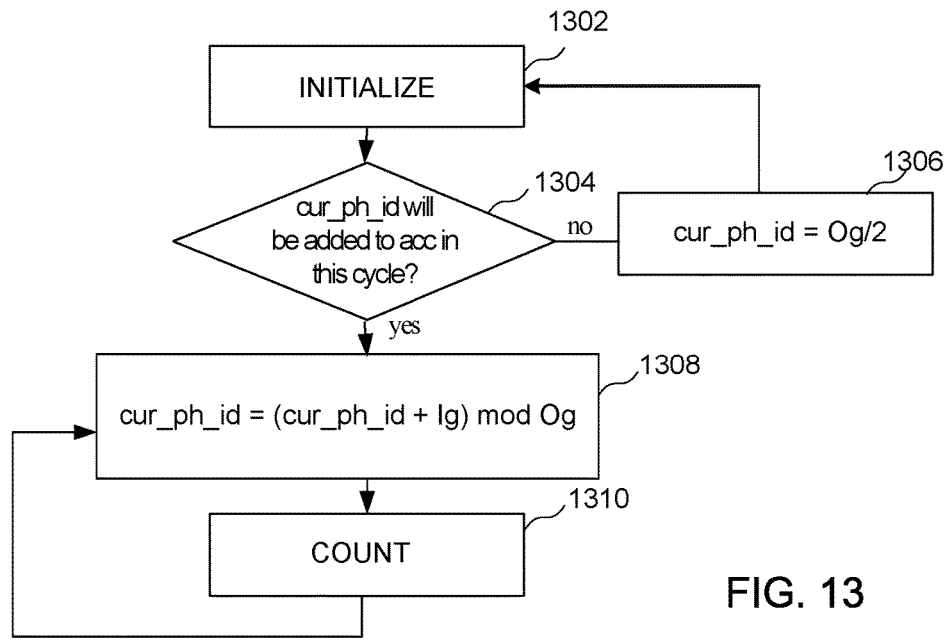
FIG. 13 is a flow chart showing the maintenance of a current phase value.

FIG. 13 shows a flow chart for the maintenance of cur_ph_id as described above. This takes place concurrently with the operation of the FSM of FIG. 12. In particular, with the reset_sync set equal to a value of 1, the finite state machine enters an initialize state at a block 1302. It is determined whether the value of the cur_ph_id will be added to the acc value in a given cycle at a block 1308 (this is a reference to block 1212 in FIG. 12). If the cur_ph_id is not to be added to acc at the block 1308 in the current clock cycle, then cur_ph_id is set equal to Og/2 at a block 1310. It should be noted that the "no" decision branch must be followed at least once for proper initialization of cur_ph_id. This is assured, because cur_ph_id will not be added to acc immediately coming out of reset. If the cur_ph_id will be added to the acc in the cycle, the cur_ph_id is equal to (cur_ph_id+Ig) mod Og at a block 1308. The FSM then enters a COUNT state at a block 1310. When the FSM enters the COUNT state, it will remain there indefinitely, updating the cur_ph_id in every cycle, and without returning to INIT state until a. reset_sync becomes 1 again In general, assuming the reset control circuit is driven by sysclk using samples of pma_clk, and with Ig and Og being the relatively prime integers expressing the relative input (sysclk) and output (pma_clk) clock periods for the data width conversion circuit, then the phase counter to track the current phase of sysclk relative to pma_clk should be updated by cur_ph_id (current phase id)=(cur_ph_id+Ig) mod Og, where Ig is the input clock period (e.g. 66T) and Og is the output clock period (e.g. 64T). When Ig>Og, this is equivalent to (cur_ph_id+(Ig−Og)) mod Og. It should be noted that Ig and Og should be relatively prime. If they are not relatively prime, then cur_ph_id will not acquire all possible values. For example, if an initial cur_ph_id=0 and next cur_ph_id=(cur_ph_id+2) mod 64 are used, (e.g. Ig=66 and Og=64), then cur_ph_id will never assume an odd value. If the calculated average phase target_ph_id happens to be odd, then cur_ph_id will never match it. In this case, Ig or Og should use the relatively prime values Ig=33 and Og=32 instead of 66 and 64.

Figure 14:
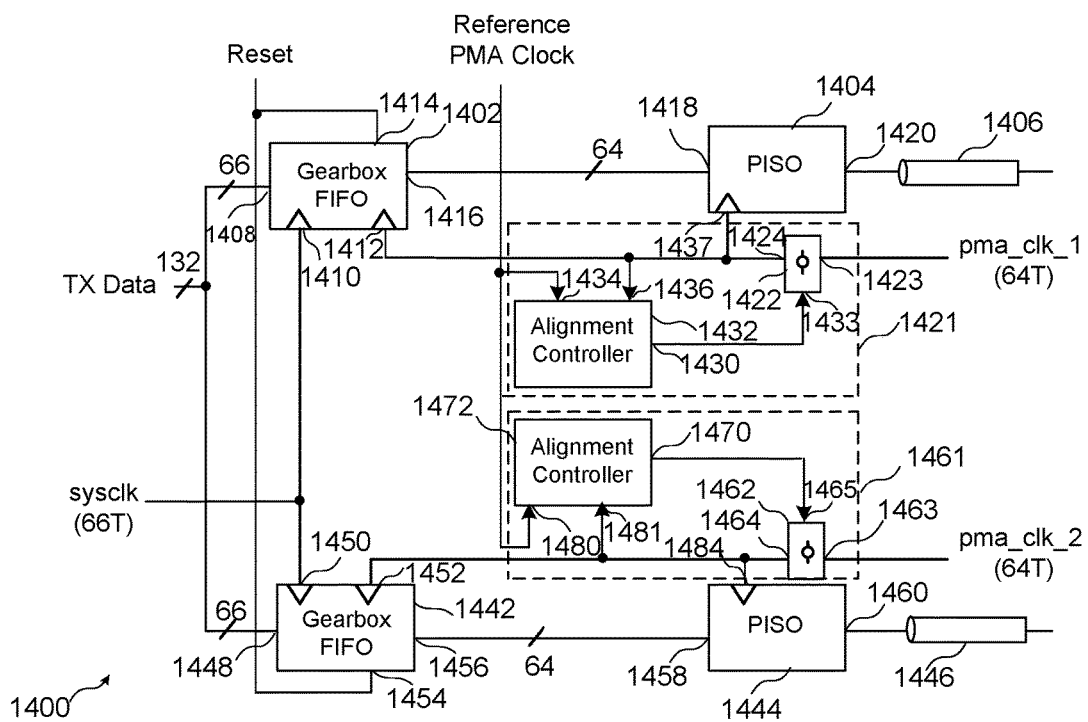
FIG. 14 is a block diagram of a circuit having a plurality of transmitters, receiving a common reset value, for transmitting data in parallel.

Turning now to FIG. 14, a block diagram of a circuit 1400 having a plurality of transmitters for transmitting data in parallel. The circuit of FIG. 14 comprises a data width conversion circuit 1402 associated with a first transmitter coupled to a parallel-in, serial-out circuit 1404 which provides serial data to a transmission line 1406. More particularly, an input 1408 is coupled to receive the transmit data (TX data), while the system clock is coupled to a first clock input 1410 and a first transmitter clock (i.e. a first base transmitter clock signal pma_clk_1) is coupled to a second clock input 1412. A reset signal may also be coupled to an input 1414. 64-bit parallel output data is generated at an output 1416. The 64-bit parallel output data is coupled to an input 1418 of the PISO circuit 1404. The serial output data is generated at the output 1420 and coupled to the transmission line 1406.

An alignment control circuit 1421 associated with the first transmitter comprises a phase control circuit 1422 coupled to receive the transmitter clock at an input 1423 and generate a phase adjusted transmitter clock at an output 1424. The phase based upon a control signal generated at an output 1430 of an alignment controller 1432, which is coupled to an input 1433 of the phase control circuit 1422. The alignment controller is coupled to receive a transmitter reference clock (Reference PMA Clock) at an input 1434 and the phase adjusted transmitter clock at an input 1436. The phase adjusted transmitter clock is also coupled to a clock input 1437 of the PISO 1404.

The circuit of FIG. 14 also comprises a data width conversion circuit 1442 associated with a second transmitter coupled to a parallel-in, serial-out circuit 1444 which provides serial data to a transmission line 1446. More particularly, an input 1448 is coupled to receive the transmit data, while the system clock is coupled to at an input 1450 and a second transmitter clock (i.e. a second base transmitter clock signal pma_clk_2) is coupled to a second clock input 1452. The reset signal may also be coupled to an input 1454. The 66-bit parallel input data is converted to 64-bit parallel input data generated at an output 1456. The 64-bit parallel output data is coupled to an input 1458 of the PISO circuit 1444. The serial output data is generated at the output 1460 and coupled to the transmission line 1446.

An alignment control circuit 1461 associated with the second transmitter comprises a phase control circuit 1462 coupled to receive the second transmitter clock at an input 1463 and generate a phase adjusted transmitter clock at an output 1464 based upon a control signal generated at an output 1470 of an alignment controller 1472. The control signal is coupled to an input 1465 of the phase control circuit 1462. The alignment controller is coupled to receive the transmitter reference clock (Reference PMA Clock) at an input 1480 and the phase adjusted transmitter clock at an input 1481. The phase adjusted transmitter clock is also coupled to a clock input 1484 of the PISO 1444.

According to the implementation of FIG. 14, a reference signal at the PMA clock frequency is distributed across the several transmitters, and the PMA clocks are aligned to this reference. Accordingly, the implementation of FIG. 14 ensures that each data width conversion circuit has the same data latency. To achieve the same data latency, the startup of the data width conversion circuits from a reset condition is coordinated across the several transmitters, after the PMA clocks have been aligned with each other using the reference PMA clock, As with the implementation of FIG. 3, an objective of FIG. 14 is to equalize the latencies of the two transmitter data paths, from the fabric generating the transmit data all the way to the serial lines.

Figure 15:
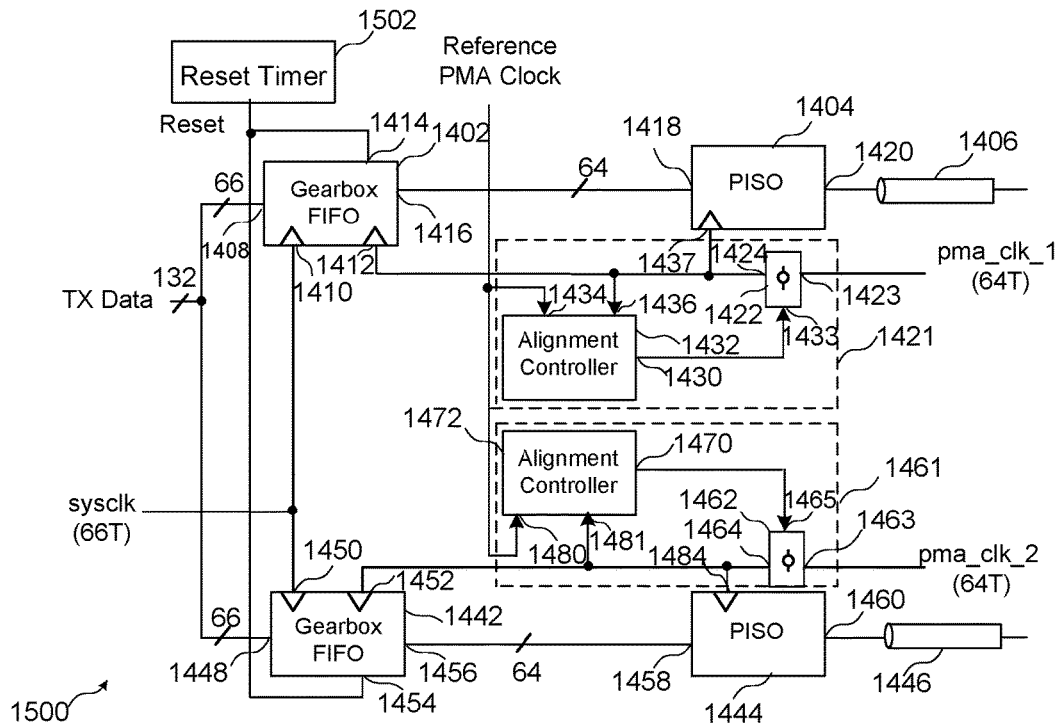
FIG. 15 is a block diagram of a circuit having a plurality of transmitters, under control of a reset timer, for transmitting data in parallel.

The alignment control circuit 1421 and 1461 can adjust the PMA clock phases to match each other. If the data coming out of the data width conversion circuits are aligned with each other, then the serial outputs also will be aligned. That is, a single reset coordinates the resetting of the data width conversion circuits so that the data width conversion circuits come up in the same state simultaneously. As shown in the embodiment of FIG. 15, a reset timer 1502 is used to generate the reset signal. The reset timer 1502 could be implemented as shown and described in reference to FIG. 4.

Figure 16:
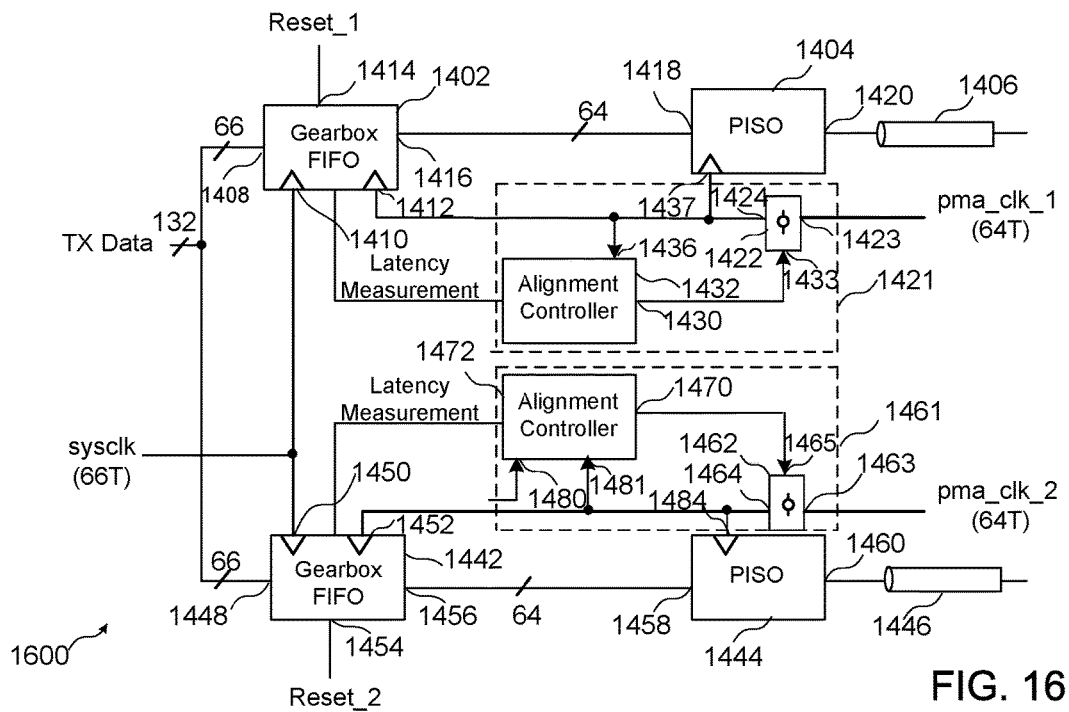
FIG. 16 is a block diagram of a circuit having a plurality of transmitters for transmitting data in parallel based upon latency measurements associated with data width conversion circuits of the transmitters.

Turning now to FIG. 16, a block diagram of a circuit having a plurality of transmitters for transmitting data in parallel is shown, where the data width conversion circuit 1402 receives a first reset signal (Reset_1) at the input 1414 and the second data width conversion circuit 1442 receives a second reset signal (Reset_2) at the input 1454. As shown in FIG. 16, a first latency measurement signal generated by the data width conversion circuit 1402 and coupled to the alignment controller 1432, and a second latency measurement signal generated by the data width conversion circuit 1442 and coupled to the alignment controller 1472. According to the implementation of FIG. 16, transmitter skew is eliminated without the alignment of the PMA clocks between lanes. The implementation of FIG. 16 enables the serial links to be aligned if the latency of the two transmitter data paths is the same, regardless of internal clock phases. Logic in each data width conversion circuit measures the data latency through the FIFO. The alignment control circuits adjust the phase of the PMA clocks in order to make the observed data width conversion circuit latencies match some target. Unlike the implementation of FIG. 3 that achieves a fast, approximate alignment, the implementation of FIG. 16 is slower process, but it achieves better alignment by superior matching of data path latency across multiple transmitters. Further, unlike the implementations of FIG. 14 and FIG. 15, the implementation of FIG. 16 requires no distribution of reference clock phases or control signals across multiple transmitters.

The implementation of FIG. 16 also uses the same principle as shown in FIG. 3, where transmitter skew is reduced by equalizing the latency through the data width conversion circuits without regard to internal clock phases. However, the circuit of FIG. 16 is slower than the circuit of FIG. 3, where serial link alignment can be achieved within several hundred clock cycles in the implementation of FIG. 3, compared to tens or even hundreds of thousands of cycles using the implementation of FIG. 16 due to the length of time required for statistical measurements of latency. Further, the circuit of FIG. 3 does not require use of the transmitter phase interpolator, which requires an additional amount of power.

To summarize, the arrangements of FIGS. 14 and 15 can eliminate the input skew, leaving much reduced skew at the outputs. While this may result in a better outcome, it requires coordination across the lanes. That is, the Reference PMA Clock must be shared between lanes, and therefore would be required to have very low inter-lane skew. Further, the data width conversion circuit reset/startup is required to be coordinated across lanes. FIG. 16 equalizes the data path latencies from inputs 1408/1448 to outputs 1420/1460. This is a simple approach, as it does not require coordination between the lanes. However, one disadvantage is that any timing skew present at inputs 1408/1448 appears as skew on outputs 1420/1460. The skew present on the inputs may exceed the desired/required skew on the outputs.

Figure 17:
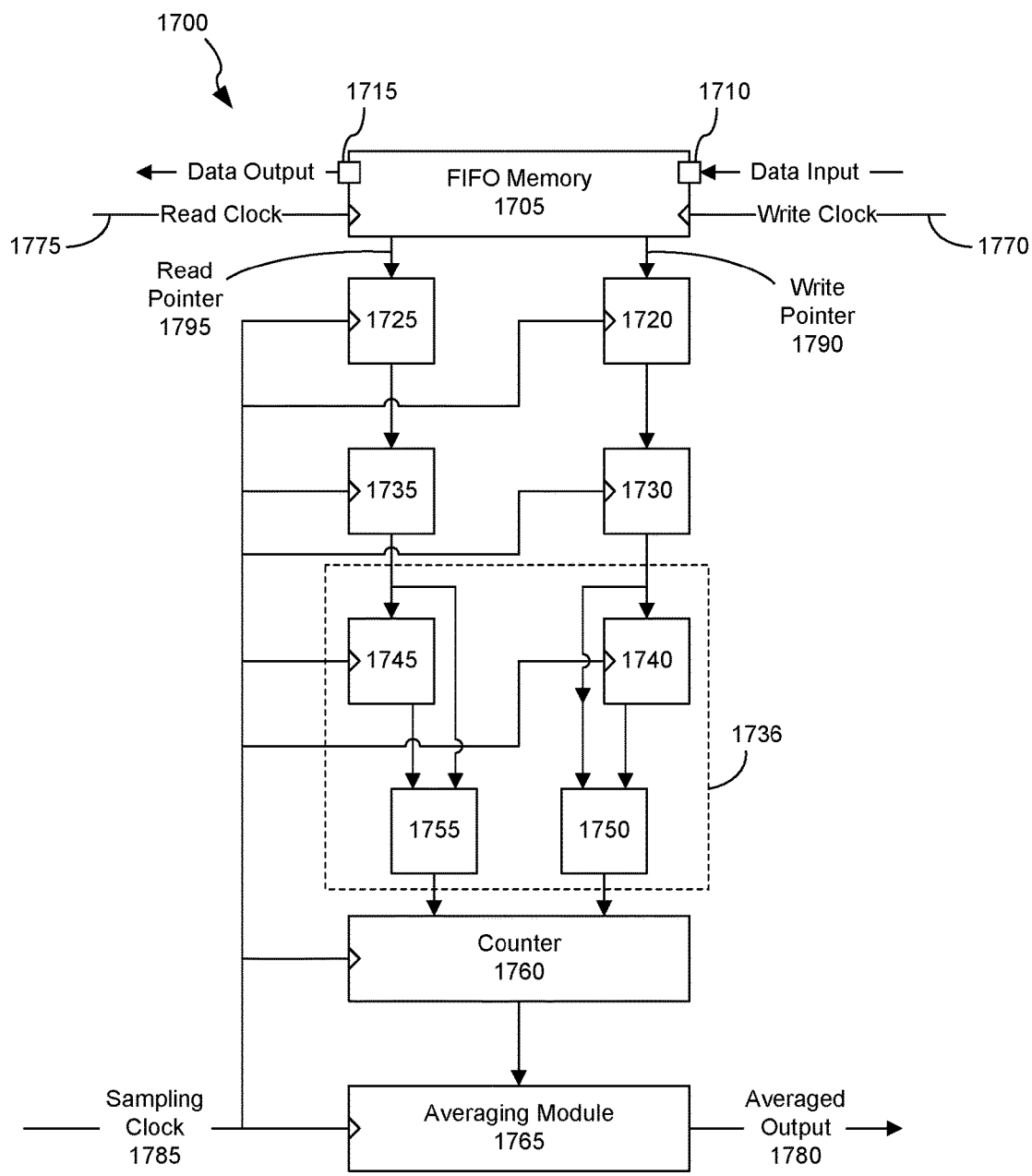
FIG. 17 is a block diagram illustrating a system for determining transmit time across an asynchronous, first-in, first-out memory.

Turning now to FIG. 17, is a block diagram illustrates a system 1700 for determining transit time, and therefore the latency, across an asynchronous, FIFO memory in accordance with one implementation of the present invention. A FIFO memory 105 can include an input data port 1710 and an output data port 1715. The FIFO memory 1705 further can be coupled to a write clock 1770 operating at a write frequency as well as a read clock 1775 operating at a read frequency. The write clock 1770 can control operation of the write pointer 190 of the FIFO memory 1705 and the read clock 1775 can control operation of the read clock pointer 1795 of the FIFO memory 1705.

As known, the write pointer 1790 can be incremented on each cycle of the write clock 1770. The write pointer 1790 can store an address or value indicating a location within the FIFO memory 1705 to which data is to be written. The read pointer 1795 can be incremented on each cycle of the read clock 1775. The read pointer 1795 can store an address or value indicating a location within the FIFO memory 1705 from which data is to be read. The write pointer 1790 and the read pointer 1795 can be incremented until such time that each cycles around to the beginning of the FIFO memory 1705.

The FIFO memory 1705 can function as an interface between two different clock domains. For example, the FIFO memory 1705 may be included within a communication system, where the write clock 1770 of the FIFO memory 1705 and the read clock 1775 of the FIFO memory 1705 typically operate at the same frequency, but are not derived from the same clock source.

Often, the read clock 1775 is generated onboard or local to the FIFO memory 1705, while the write clock 1770 is recovered from an incoming data stream. Accordingly, the read clock 1775 and the write clock 1770 typically are not phase related. Further, the frequency of the read clock 1775 and the write clock 1770 will drift against one another as the communication system continues to operate. Due to the continual drift, the delay of the FIFO memory 1705, e.g., the transit time, must be continually measured as the communication system including the FIFO memory 1705 operates.

In one embodiment, the system 1700 can include a first stage of registers including registers 1720 and 1725. An indication of the value of the write pointer 1790 (hereafter "write pointer") can be written from the FIFO memory 1705 to register 1720. An indication of the value of the read pointer 1795 (hereafter "read pointer") can be written from the FIFO memory 1705 to register 1725. Both registers 1720 and 1725 can be clocked according to a sampling clock 1785 operating at a given frequency, e.g., the "sampling frequency."

The sampling frequency of the sampling clock 1785 can be independent of the frequency of the write clock 1770 and the read clock 1775 of the FIFO memory 1705. The sampling frequency need not be derived from the write clock 1770 or the read clock 1775. In one embodiment, the sampling frequency need only be higher than the frequency of the write clock 1770 of the FIFO memory 1705 and higher than the frequency of the read clock 1775 of the FIFO memory 1705.

In another embodiment, due to various effects upon the write clock 1770 and the read clock 1775, e.g., jitter and other uncertainties, the sampling frequency can be set high enough so that at least one period of the sampling clock 1785 occurs between consecutive cycles of the write clock 1770 and consecutive cycles of the read clock 1775. The sampling frequency should be set high enough so that two transitions of the write clock 1770 or the read clock 1775 do not occur without a sample of the write pointer 1790 and the read pointer 1795 being taken, e.g., loaded into registers 1720 and 1725 respectively. In one embodiment, the sampling frequency can be set to a value that is approximately 10%, or more, higher than each of the write clock 1770 and the read clock 1775.

It should be appreciated that specific percentages have been proposed herein for purposes of illustration only and not to suggest or limit the embodiments to any one particular percentage or sampling frequency. The sampling frequency may be any other percentage higher than the write clock 1770 and the read clock 1775 so long as the constraints described herein are observed.

In another embodiment, system 1700 can include a second stage of registers including registers 1730 and 1735. Each of registers 1730 and 1735 also can be driven or clocked by the sampling clock 1785. The write pointer 1790 can be propagated from register 1720 to register 1730 on successive cycles of the sampling clock 1785. The read pointer 1795 can be propagated from register 1725 to register 1735 on successive cycles of the sampling clock 1785. Taken collectively, the first stage and the second stage of registers 1720-1735 double-register the write pointer 1790 and the read pointer 1795. Double registering can reduce the probability of an indeterminate state being registered and propagated through system 1700, thereby increasing the overall stability of system 1700.

System 1700 further can include a comparator module 1736. The comparator module 1736 can include registers 1740 and 1745 as well as comparators 1750 and 1755. The write pointer 1790 can be propagated from register 1730 to register 1740. Register 1740 can serve as a delay that delays the write register 1790 by one cycle of the sampling clock 1785. Comparator 1750 can receive the write pointer 1790 from register 1730 and a delayed version of the write pointer 1790 from register 1740. Comparator 1750 can compare the write pointer 1790 with the delayed write pointer 1790 to determine whether a change in the write pointer 1790 has occurred.

Similarly, the read pointer 1795 can be propagated from register 1735 to register 1745. Register 1745 can function as a delay, which delays the read pointer 1795 by one cycle of the sampling clock 1785. Comparator 1755 can receive the read pointer 1795 from register 1735 and a delayed version of the read pointer 1795 from register 1745. Comparator 1755 can compare the read pointer 1795 with the delayed read pointer 1795 to determine whether a change in the read pointer 1795 has occurred.

Each of comparators 1750 and 1755 can provide an output to counter 1760. Comparator 1750 can output a signal to counter 1760 that indicates when the write pointer 1790 changes or has changed. Comparator 1755 can output a signal to counter 1760 that indicates when the read pointer 1795 changes or has changed.

Counter 1760, also driven by the sampling clock 1785, can receive the output from each of comparators 1750 and 1755. Counter 1760 can store a count value (count). The counter 1760 can be configured to increment the count when only the write pointer 1790 changes as indicated by the signal output from comparator 1750. Counter 1760 can be configured to decrement the count when only the read pointer 1795 changes as indicated by the signal output from comparator 1755. When both the write pointer 1790 and the read pointer 1795 change, the counter 1760 can be configured leave the count unchanged, e.g., not increment the count. Similarly, when neither the write pointer 1790 nor the read pointer 1795 change, the counter 1760 can be configured to leave the count unchanged.

An averaging module 1765 can be coupled to the counter 1760 and clocked by the sampling clock 1785. The count stored within the counter 1760 can be provided to the averaging module 1765 each cycle of the sampling clock 1785. The averaging module 1765, being clocked by the sampling clock 1785, can average the count over a predetermined number of cycles of the sampling clock 1785. The averaging module 1765 can output the averaged count 1780. The averaged count 1780, e.g., the average occupancy of the FIFO memory 1705, indicates the transit time of the FIFO module 1705. For example, the average occupancy, as measured in read/write clock cycles of the FIFO memory 1705, can be multiplied by the nominal period of the read/write clock to indicate transit time. As used herein, "outputting" can include, but is not limited to, writing to a file, writing to a user display or other output device, playing audible notifications, sending or transmitting to another system, exporting, or the like.

In one embodiment, the indication of the value of the write pointer 1790 and the indication of the value of the read pointer 1795 that is passed to registers 1720 and 1725 respectively can be the actual value of each respective pointer. The value of the write pointer 1790 can be passed to register 1720 and the value of the read pointer 1795 can be passed to register 1725. Both the value of the write pointer 1790 and the value of the read pointer 1795 can be specified using gray code. The use of gray code results in only a single bit changing when the write pointer 1790 and/or the read pointer 1795 is incremented, thereby reducing the uncertainty in system 1700.

In another embodiment, the value of the write pointer 1790 and the value of the read pointer 1795 can be specified in binary format. In that case, rather than propagating the entire value of the write pointer 1790 and the entire value of the read pointer 1795, only the least significant bit of each pointer need be obtained, e.g., sampled, and propagated. Accordingly, the least significant bit of the write pointer 1790 can be loaded into register 1720 and propagated. Similarly, only the least significant bit of the read pointer 1795 can be loaded into register 1725 and propagated. This embodiment further provides benefits similar to those attained using gray code where only a single bit changes when the state of either pointer changes.

The embodiment in which the entire write pointer 1790 value and the entire read pointer 1795 value are propagated will require a greater bit width than the case in which only the least significant bit is sampled. Thus, more registers at each respective stage of system 1700 up to the counter 1760 will be needed and depend upon the width of the pointers, e.g., one register for each bit. The embodiment in which only the least significant bit of each pointer is propagated reduces the bit width of each stage to a single bit for each pointer and, thus, the size of system 1700.

Figure 18:
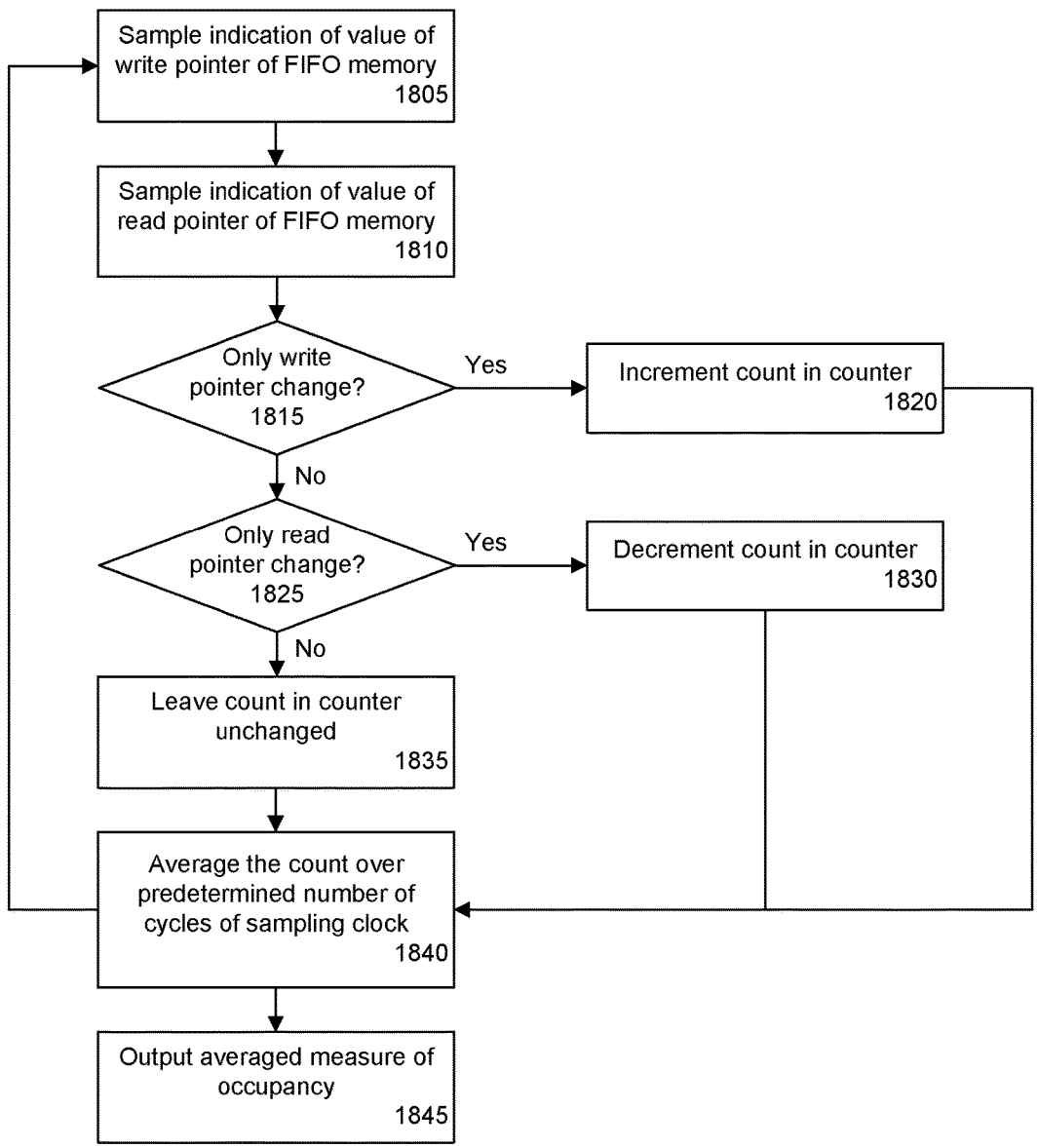
FIG. 18 is a flow chart illustrating a method of determining transit time across an asynchronous FIFO memory.

Turning now to FIG. 18, a flow chart illustrating a method of determining transit time across an asynchronous, FIFO memory in accordance with another embodiment of the present invention. The method can be performed using a system such as the system described with reference to FIG. 17. The method can begin in step 1805 where an indication of the value of the write pointer of the FIFO memory can be sampled. In step 1810, an indication of the value of the read pointer of the FIFO memory can be sampled.

As noted, in one embodiment, the indication of the value of the write pointer and the read pointer can be the actual value of each respective pointer specified using gray code format. In another embodiment, the indication of the value of the write pointer and the read pointer can be the least significant bit of each respective pointer specified in binary format. Both the write pointer and the read pointer can be sampled via double registering at a specified sampling frequency. At each cycle of the sampling frequency, another sample pair, including a sample of the write pointer and a sample of the read pointer, can be taken and propagated through to the comparator module.

Beginning in step 1815, a measure of fractional occupancy of the FIFO memory can be calculated. A count in a counter can be incremented, decremented, or left unchanged according to whether the write pointer and/or read pointer changes from one sampling cycle to the next. As the sample clock operates at a frequency that exceeds both the write clock and the read clock of the FIFO memory, the count, which reflects the occupancy of the FIFO memory, can be said to be fractional.

In step 1815, a determination can be made as to whether only the write pointer changed with respect to a current sample pair of the write pointer and the read pointer. If so, the method can continue to step 1820 where the count in the counter can be incremented. If not, the method can proceed to step 1825. In step 1825, a determination can be made as to whether only the read pointer changed with respect to a current sample pair of the write pointer and the read pointer. If so, the method can proceed to step 1830 where the count in the counter can be decremented. If not, the method can continue to step 1835. In step 1835, the count in the counter can be left unchanged as either both the write pointer and the read pointer changed or neither the write pointer nor the read pointer changed.

In step 1840, the count in the counter can be averaged with one or more prior count values. The count can be averaged over a selected number of cycles of the sampling frequency. The averaged count can be output in step 1845. It should be appreciated that as the averaged count is output, the method further can loop back to step 1805 to continue sampling further indications of the write and read pointer values of the FIFO memory. Additional details related to the circuit of FIG. 17 and the method of FIG. 18 can be found in U.S. Pat. No. 7,594,048, the entire application of which is incorporated herein by reference.

Figure 19:
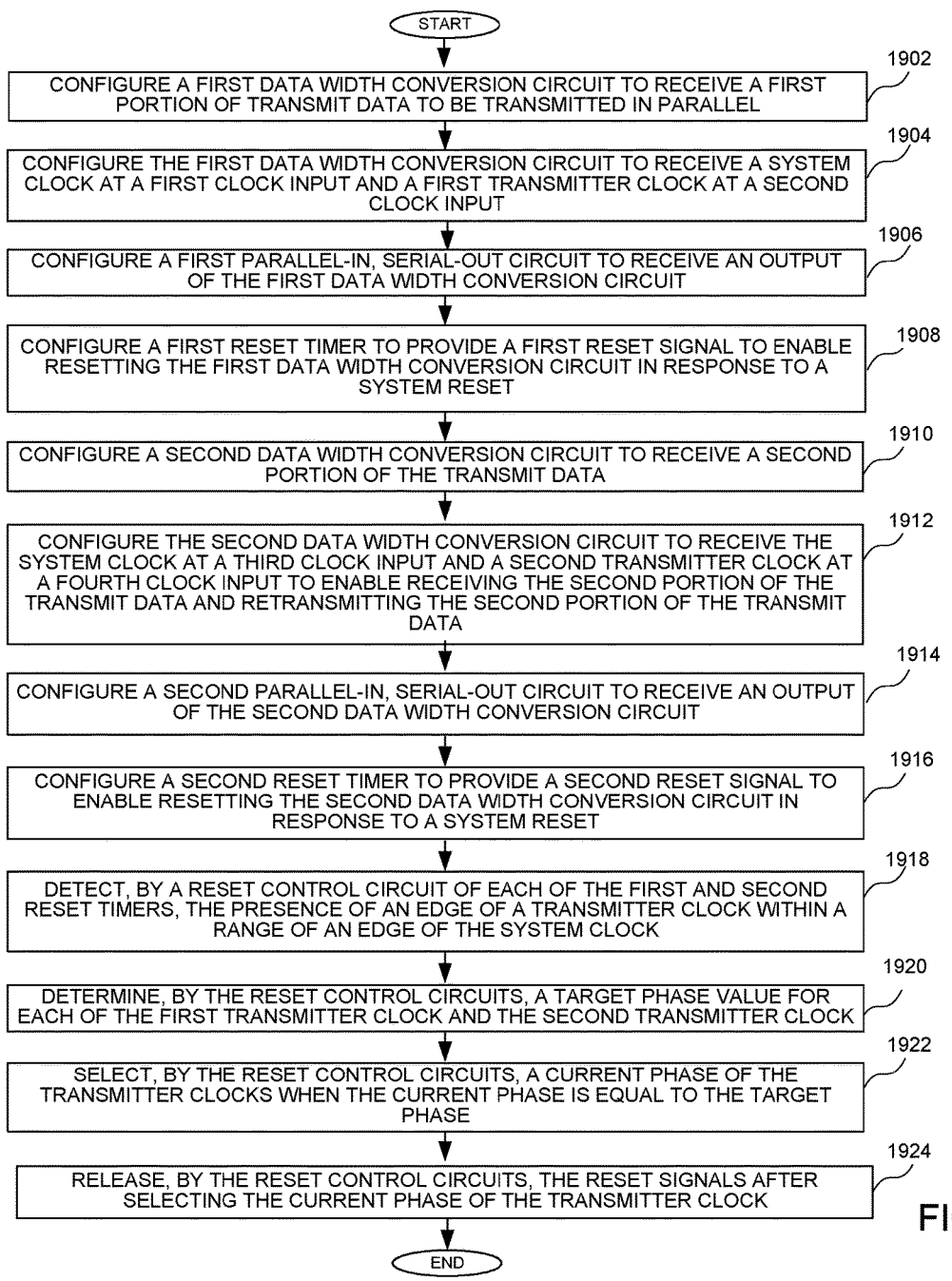
FIG. 19 is a flow chart showing a method of transmitting data using a reset timer for each transmitter of a plurality of transmitters.

Turning now to FIG. 19, a flow chart shows a method of transmitting data using a reset timer for each transmitter of a plurality of transmitters. The method of FIG. 19 may be implemented using the circuit of FIG. 3, for example, or some other suitable circuit. A first data width conversion circuit is configured to receive a first portion of transmit data to be transmitted in parallel at a block 1902, such as the data width conversion circuit 302. The first data width conversion circuit 302 is also configured to receive a system clock at a first clock input and a first transmitter clock to enable receiving the first portion of the transmit data and retransmit the data at a block 1904. For example, the first portion of the transmit data may be received and transmitted by the first data width conversion circuit according to a 66B/64B protocol as described above. A first parallel-in, serial-out circuit, such as PISO 306, is configured to receive an output of the first data width conversion circuit, wherein the first transmitter clock is coupled to a second clock input of the first data width conversion circuit and to a third clock input of the first parallel-in/serial-out circuit at a block 1906. A first reset timer, such as reset timer 312, is configured to provide a first reset signal in response to a system reset to enable resetting the first data width conversion circuit, such as the data width conversion circuit 302, at a block 1908. A second data width conversion circuit is configured to receive a second portion of the transmit data at a block 1910. The second data width conversion circuit is also configured to receive the system clock at a fourth clock input and a second transmitter clock at a fifth clock input to enable receiving the second portion of the transmit data and retransmitting the second portion of the transmit data at a block 1912. A second parallel-in, serial-out circuit, such as PISO 326, is configured to receive an output of the second data width conversion circuit, wherein a second transmitter clock is coupled to the fifth clock input of the second data width conversion circuit and to a sixth clock input of the second parallel-in, serial-out circuit at a block 1914. A second reset timer, such as reset timer 322, is configured to provide a second reset signal in response to the system reset to enable resetting the second data width conversion circuit at a block 1916.

During operation, the presence of an edge of a transmitter clock is detected, by a reset control circuit of each of the first and second reset timers, to within a range of an edge of the system clock at a block 1918. The phase of a transmitter clock for each of the first transmitter clock and the second transmitter clock may be selected using a target phase value that is determined as set forth above in reference to FIGS. 12 and 13. A target phase value is calculated, by the reset control circuits for each of the first transmitter clock and the second transmitter clock, at a block 1920. A current phase of the transmitter clock is selected, for each of the reset control circuits, when the current phase is equal to the target phase at a block 1922. The reset signal is released, for each of the data width conversion circuits by the reset control circuits, after selecting the current phase of the transmitter clock at a block 1924.

Figure 20:
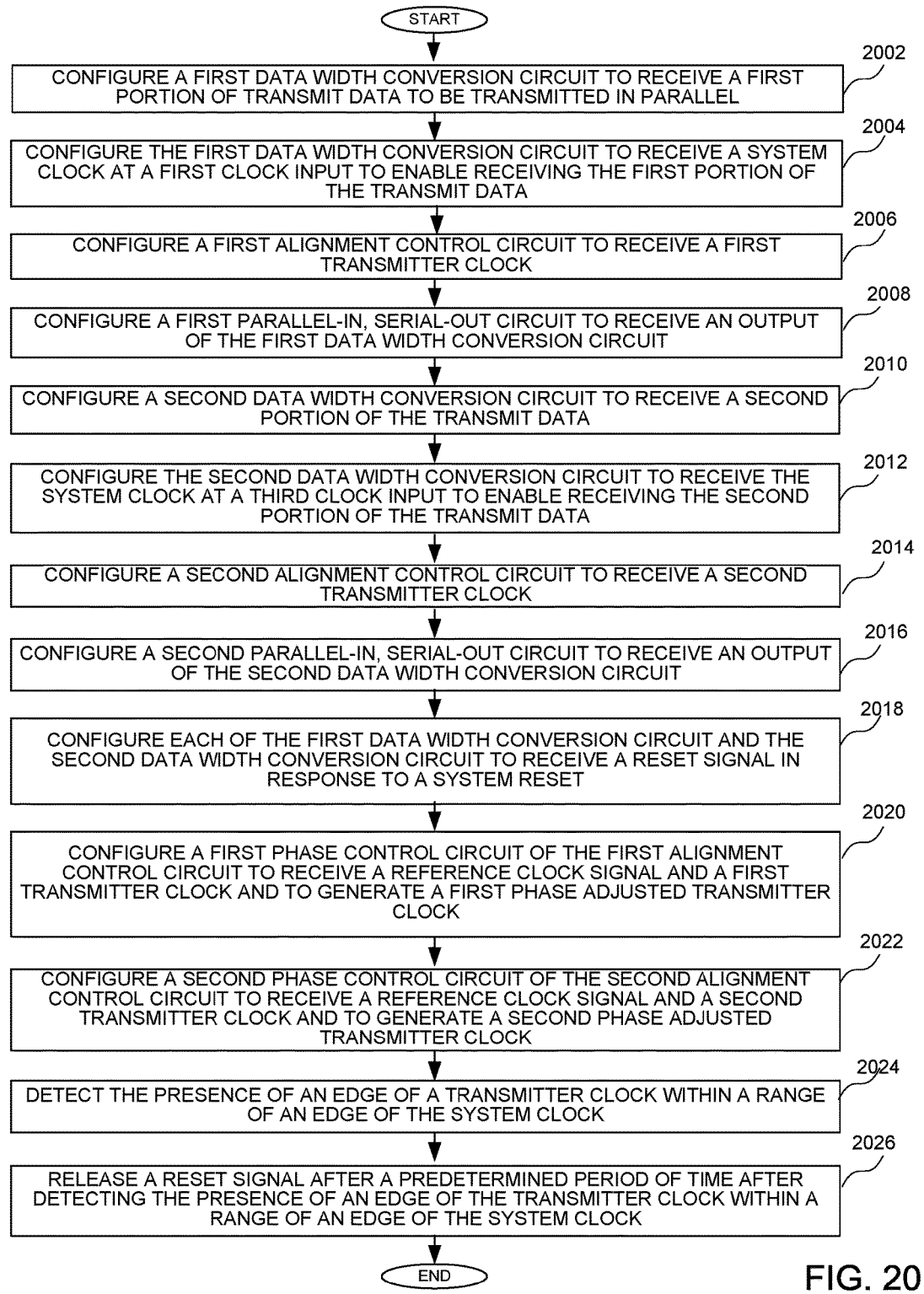
FIG. 20 is a flow chart showing a method of transmitting data using a common reset signal for each transmitter of a plurality of transmitters.

Turning now to FIG. 20, a flow chart shows a method of transmitting data using a common reset signal for each transmitter of a plurality of transmitters. The method of FIG. 20 may be implemented using the circuit of FIGS. 14 and 15, for example, or some other suitable circuits. A first data width conversion circuit, such as data width conversion circuit 1402, is configured to receive a first portion of transmit data to be transmitted in parallel at a block 2002. The first data width conversion circuit is configured to receive a system clock at a first clock input to enable receiving the first portion of the transmit data at a block 2004. A first alignment control circuit, such as alignment control circuit 1432, is configured to receive a first transmitter clock at a block 2006. A first parallel-in, serial-out circuit, such as PISO 1404, is configured to receive an output of the first data width conversion circuit, wherein the first transmitter clock is coupled to a second clock input of the first data width conversion circuit and to a third clock input of the first parallel-in, serial-out circuit at a block 2008.

A second data width conversion circuit, such as data width conversion circuit 1442, is configured to receive a second portion of the transmit data at a block 2010. The second data width conversion circuit is configured to receive the system clock at a third clock input to enable receiving the second portion of the transmit data at a block 2012. A second alignment control circuit, such as alignment controller 1472, is configured to receive a second transmitter clock at a block 2014. A second parallel-in, serial-out circuit, such as PISO 1444, is configured to receive an output of the second data width conversion circuit, wherein the second transmitter clock is coupled to a third clock input of the second data width conversion circuit and a fourth clock input of the second parallel-in, serial-out circuit at a block 2016. Each of the first data conversion circuit and the second data conversion circuit is configured to receive a reset signal in response to a system reset at a block 2018. A first phase control circuit of the first alignment control circuit is configured to receive a reference clock signal the first transmitter clock and to generate a first phase adjusted transmitter clock at a block 2020. A second phase control circuit the second aligned control circuit is configured to receive the reference clock signal and the second transmitter clock and to generate a second phase adjusted transmitter reference clock at a block 2022.

During operation of the circuits, presence of an edge of a transmitter clock within a range of an edge of the system clock is detected, by a reset timer circuit having a reset control circuit, at a block 2024. A reset signal is released, by the reset control circuit, after a predetermined period of time after detecting the presence of an edge of the transmitter clock within a range of an edge of the system clock at a block 2026.

Figure 21:
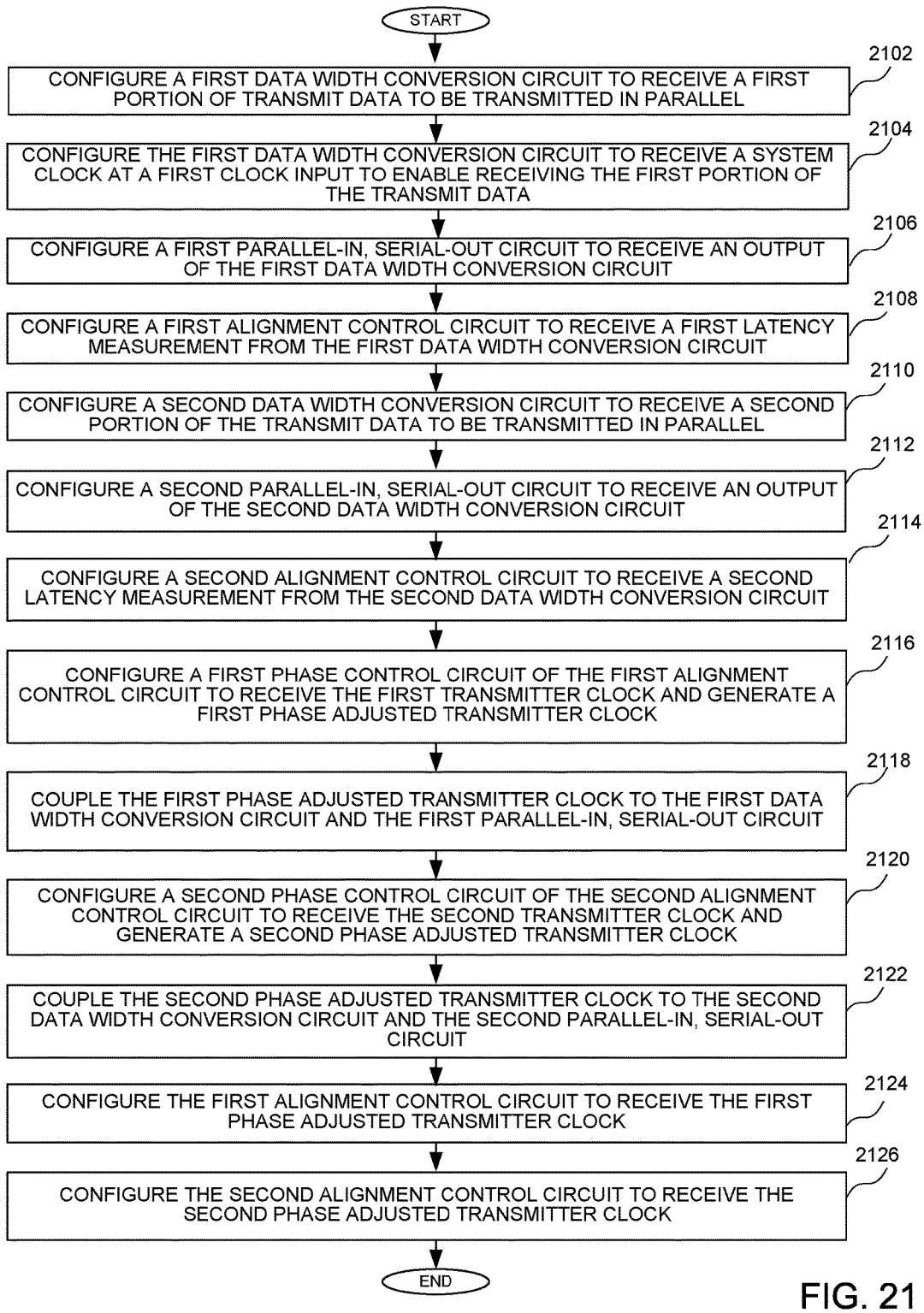
FIG. 21 is a flow chart showing a method of transmitting data using a separate latency measurements for each transmitter of a plurality of transmitters.

Turning now to FIG. 21, a flow chart shows a method of transmitting data using a separate latency measurement for each transmitter of a plurality of transmitters. The method of FIG. 21 can be implemented using the circuit of FIG. 16, for example, or some other suitable circuit. A first data width conversion circuit, such as data width conversion circuit 1402 is configured to receive a first portion of transmit data to be transmitted in parallel at a block 2102. The first data width conversion circuit is configured to receive a system clock at a first clock input to enable receiving the first portion of the transmit data at a block 2104. A first parallel-in, serial-out circuit, such as PISO 1404, is configured to receive an output of the first data width conversion circuit, wherein a first transmitter clock is coupled to a second clock input of the first data width conversion circuit and to a third clock input of the first parallel-in, serial-out circuit at a block 2106. A first alignment control circuit, such as alignment control circuit 1432, is configured to receive a first latency measurement from the first data width conversion circuit at a block 2108.

A second data width conversion circuit, such as data width conversion circuit 1442, is configured to receive a second portion of the transmit data to be transmitted in parallel, wherein the second data width conversion circuit is configured to receive the system clock at a fourth clock input to enable receiving the second portion of the transmit data at a block 2110. A second parallel-in, serial-out circuit, such as PISO 1444, is configured to receive an output of the second data width conversion circuit, wherein the second transmitter clock is coupled to a fifth clock input of the second data width conversion circuit and to a sixth clock input of the second parallel-in, serial-out circuit at a block 2112. A second alignment control circuit is configured to receive a second latency measurement from the second data width conversion circuit at a block 2114.

The method enables the generation of phase adjusted transmitter clock signal based upon latency measurements generated by the data width conversion circuits. In particular a first phase control circuit of the first alignment control circuit is configured to receive the first transmitter clock and generate a first phase adjusted transmitter clock, based upon a first latency measurement, at a block 2116. The phase of the first phase adjusted transmitter clock is selected to make the first latency measurement meet a target value. The first phase adjusted transmitter clock is coupled to the first data width conversion circuit and the first parallel-in, serial-out circuit at a block 2118. A second phase control circuit of the second alignment control circuit is configured to receive the second transmitter clock and generate a second phase adjusted transmitter clock, based upon a second latency measurement, at a block 2120. The phase of the second phase adjusted transmitter clock is selected to make the second latency measurement meet a target value. The second phase adjusted transmitter clock is coupled to the second data width conversion circuit and the second parallel-in, serial-out circuit at a block 2122. The first alignment control circuit is configured to receive the first phase adjusted transmitter clock at a block 2124. The second alignment control circuit is configured to receive the second phase adjusted transmitter clock at a block 2126.

It can therefore be appreciated that new to circuits for and methods of transmitting data in an integrated circuit have been described. It will be appreciated by those skilled in the art that numerous alternatives and equivalents will be seen to exist that incorporate the disclosed invention. As a result, the invention is not to be limited by the foregoing embodiments, but only by the following claims.

I claim:

1. A circuit for transmitting data in an integrated circuit device, the circuit comprising:
   a first data width conversion circuit configured to receive a first portion of transmit data to be transmitted in parallel, the first data width conversion circuit configured to receive a system clock at a first clock input to enable receiving the first portion of the transmit data;
   a first parallel-in, serial-out circuit configured to receive an output of the first data width conversion circuit, wherein a first transmitter clock is coupled to a second clock input of the first data width conversion circuit and to a third clock input of the first parallel-in/serial-out circuit;
   a first reset timer configured to receive the system clock and to provide a first reset signal to enable resetting the first data width conversion circuit, wherein the first reset signal is synchronized to the system clock;
   a second data width conversion circuit configured to receive a second portion of the transmit data, the second data width conversion circuit configured to receive the system clock at a fourth clock input to enable receiving the second portion of the transmit data;
   a second parallel-in, serial-out circuit configured to receive an output of the second data width conversion circuit, wherein a second transmitter clock is coupled to a fifth clock input of the second data width conversion circuit and to a sixth clock input of the second parallel-in, serial-out circuit; and
   a second reset timer configured to receive the system clock and to provide a second reset signal to enable resetting the second data width conversion circuit, wherein the second reset signal is synchronized to the system clock.

2. The circuit of claim 1 wherein each of the first and second reset timers comprises a reset control circuit that detects the presence of an edge of a transmitter clock and the presence of an edge of the system clock.

3. The circuit of claim 2 wherein the reset control circuit generates a reset signal after a predetermined period of time after detecting the presence of an edge of the transmitter clock and the presence of an edge of the system clock.

4. The circuit of claim 3 wherein the reset control circuit generates the reset signal after detecting a predetermined number of edges of the transmitter clock and the presence of an edge of the system clock.

5. The circuit of claim 2 wherein the reset control circuit determines a target phase value.

6. The circuit of claim 5 wherein the reset control circuit selects a current phase of the transmitter clock when the current phase is equal to the target phase value.

7. The circuit of claim 6 wherein the reset control circuit releases the reset signal after selecting the current phase of the transmitter clock.

8. A circuit for transmitting data in an integrated circuit device, the circuit comprising:
   a first data width conversion circuit configured to receive a first portion of transmit data to be transmitted in parallel, wherein the first data width conversion circuit is configured to receive a system clock at a first clock input to enable receiving the first portion of the transmit data;
   a first alignment control circuit configured to receive a first base transmitter clock and a transmitter reference clock to generate a first transmitter clock;
   a first parallel-in, serial-out circuit configured to receive an output of the first data width conversion circuit, wherein the first transmitter clock is coupled to a second clock input of the first data width conversion circuit and to a third clock input of the first parallel-in, serial-out circuit;
   a second data width conversion circuit configured to receive a second portion of the transmit data, wherein the second data width conversion circuit is configured to receive the system clock at a fourth clock input to enable receiving the second portion of the transmit data;
   a second alignment control circuit configured to receive a second base transmitter clock and the transmitter reference clock to generate a second transmitter clock; and
   a second parallel-in, serial-out circuit configured to receive an output of the second data width conversion circuit, wherein the second transmitter clock is coupled to a fifth clock input of the second data width conversion circuit and a sixth clock input of the second parallel-in, serial-out circuit.

9. The circuit of claim 8 wherein each of the first data width conversion circuit and the second data width conversion circuit is configured to receive a reset signal.

10. The circuit of claim 8 wherein each of the first data width conversion circuit and the second data width conversion circuit receives a common reset signal.

11. The circuit of claim 8 wherein the first transmitter clock and the second transmitter clock are aligned using the transmitter reference clock.

12. The circuit of claim 8 wherein the first data width conversion circuit is configured to receive a first reset signal and the second data width conversion circuit is configured to receive a second reset signal.

13. The circuit of claim 8 wherein the first alignment control circuit is configured to receive a first latency measurement from the first data width conversion circuit, and the second alignment control circuit configured to receive a second latency measurement from the second data width conversion circuit.

14. The circuit of claim 8 wherein the first alignment control circuit is configured to receive the first transmitter clock, and the second alignment control circuit is configured to receive the second transmitter clock.

15. A method of transmitting data in an integrated circuit device, the circuit comprising:
   configuring a first data width conversion circuit to receive a first portion of transmit data to be transmitted in parallel and to receive a system clock at a first clock input to enable receiving the first portion of the transmit data;
   configuring a first parallel-in, serial-out circuit to receive an output of the first data width conversion circuit, wherein a first transmitter clock is coupled to a second clock input of the first data width conversion circuit and to a third clock input of the first parallel-in/serial-out circuit;
   configuring a first reset timer to receive the system clock and to provide a first reset signal to enable resetting the first data width conversion circuit, wherein the first reset signal is synchronized to the system clock;
   configuring a second data width conversion circuit to receive a second portion of the transmit data to receive the system clock at a fourth clock input to enable receiving the second portion of the transmit data;
   configuring a second parallel-in, serial-out circuit to receive an output of the second data width conversion circuit, wherein a second transmitter clock is coupled to a fifth clock input of the second data width conversion circuit and to a sixth clock input of the second parallel-in, serial-out circuit; and
   configuring a second reset timer to receive the system clock and to provide a second reset signal to enable resetting the second data width conversion circuit, wherein the second reset signal is synchronized to the system clock.

16. The method of claim 15 further comprising independently detecting, by reset control circuits of the first and second reset timers, the presence of an edge of a transmitter clock and the presence of an edge of the system clock.

17. The method of claim 16 further comprising releasing a reset signal after a predetermined period of time after detecting the presence of an edge of the transmitter clock and the presence of an edge of the system clock.

18. The method of claim 17 further comprising releasing the reset signal after detecting a predetermined number of edges of the transmitter clock and the presence of an edge of the system clock.

19. The method of claim 16 further comprising determining a target phase value.

20. The method of claim 19 further comprising selecting a current phase of the transmitter clock when the current phase is equal to the target phase, and releasing the reset signal after selecting the current phase of the transmitter clock.

* * * * *